(12) United States Patent
Tsuda

(10) Patent No.: US 12,125,703 B2
(45) Date of Patent: Oct. 22, 2024

(54) METHOD OF MANUFACTURING SEMICONDUCTOR DEVICE

(71) Applicant: RENESAS ELECTRONICS CORPORATION, Tokyo (JP)

(72) Inventor: Shibun Tsuda, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 404 days.

(21) Appl. No.: 17/697,418

(22) Filed: Mar. 17, 2022

(65) Prior Publication Data

US 2023/0298889 A1 Sep. 21, 2023

(51) Int. Cl.
| | |
|---|---|
| *H01L 29/76* | (2006.01) |
| *H01L 21/02* | (2006.01) |
| *H01L 21/027* | (2006.01) |
| *H01L 21/3105* | (2006.01) |
| *H01L 21/762* | (2006.01) |
| *H01L 29/94* | (2006.01) |

(52) U.S. Cl.
CPC .... *H01L 21/0272* (2013.01); *H01L 21/02126* (2013.01); *H01L 21/31051* (2013.01); *H01L 21/7624* (2013.01)

(58) Field of Classification Search
CPC ........... H01L 21/0272; H01L 21/02126; H01L 21/31051; H01L 21/7624; H01L 21/84; H01L 27/1207; H01L 29/6659; H01L 27/1203
USPC .......................................... 257/374; 438/631
See application file for complete search history.

(56) References Cited

U.S. PATENT DOCUMENTS

| | | | |
|---|---|---|---|
| 8,963,208 B2 * | 2/2015 | Flachowsky | H01L 29/78 257/347 |
| 10,529,630 B2 | 1/2020 | Maruyama et al. | |
| 2011/0215409 A1 * | 9/2011 | Li | H01L 29/4966 257/369 |
| 2020/0313000 A1 | 10/2020 | Uejima et al. | |

FOREIGN PATENT DOCUMENTS

| | | |
|---|---|---|
| JP | 2019-121632 A | 7/2019 |
| WO | 2019/097568 A1 | 5/2019 |

* cited by examiner

Primary Examiner — Theresa T Doan
(74) Attorney, Agent, or Firm — Rimon P.C.

(57) ABSTRACT

After a plurality of trenches is formed in an SOI substrate, a side surface of the insulating layer is retreated from a side surface of the semiconductor layer and a side surface of the semiconductor substrate. Next, the side surface of the insulating layer is covered with an organic film and also the side surface of the semiconductor layer is exposed from the organic film by performing an anisotropic etching process to the organic film embedded into an inside of each of the plurality of trenches. Next, each of the side surface of the semiconductor layer and the side surface of the semiconductor substrate is approached to the side surface of the insulating layer by performing an isotropic etching process. Further, after the organic film is removed, an oxidation treatment is performed to each of the side surface of the semiconductor layer and the side surface of the semiconductor substrate.

8 Claims, 21 Drawing Sheets

FIG. 13
<Region 1A of Comparative Example>
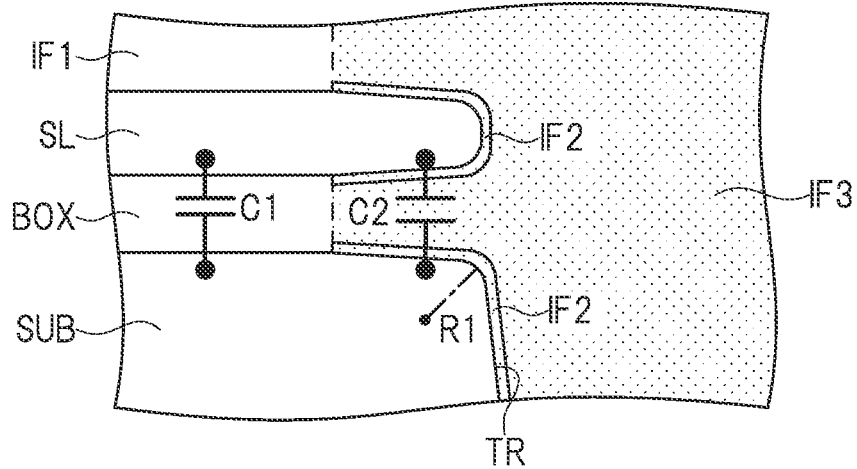
<Region 1A of First Embodiment>
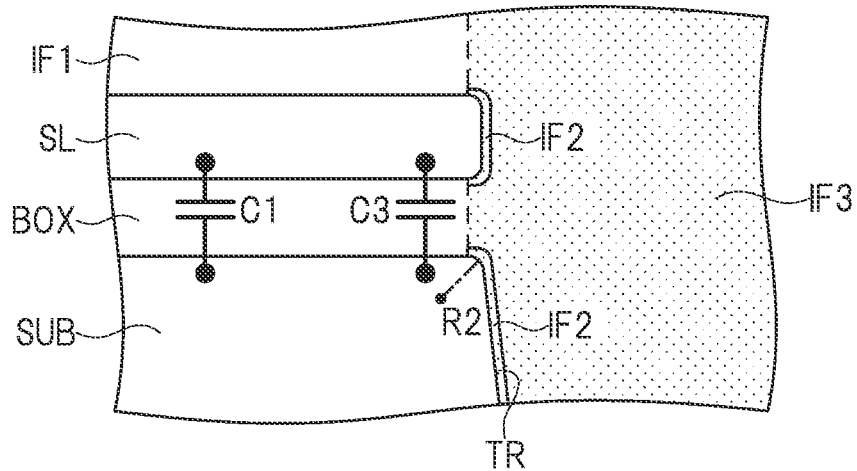
<Region 2A of First Embodiment or Comparative Example>
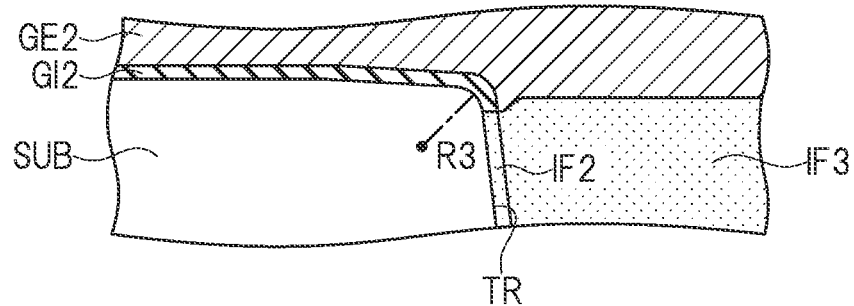

FIG. 14
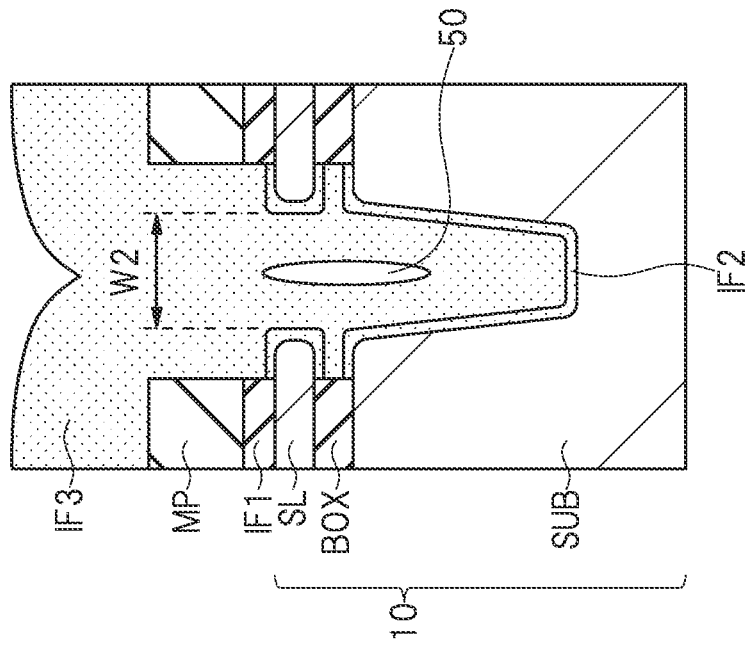
<Region 1A of First Embodiment>
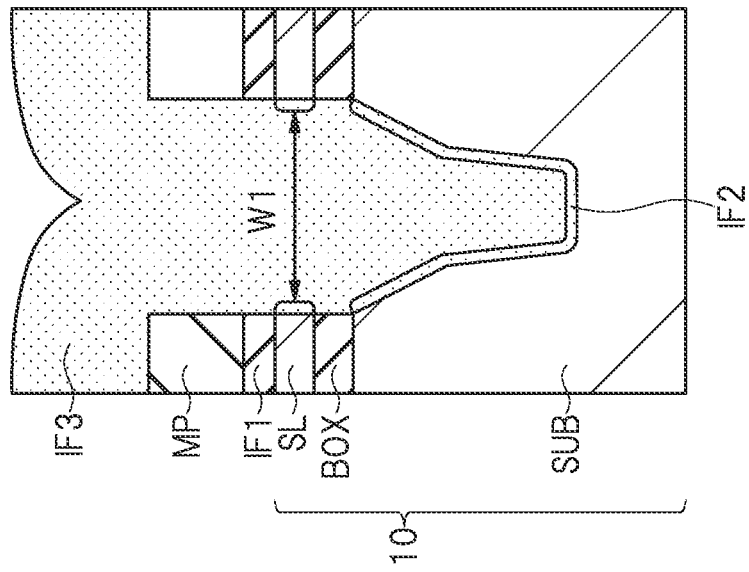
<Region 1A of Comparative Example>

METHOD OF MANUFACTURING SEMICONDUCTOR DEVICE

BACKGROUND

The present invention relates to a method of manufacturing a semiconductor device, for example, a method of manufacturing a semiconductor device provided with an SOI substrate.

As a semiconductor device for low power consumption, there is a technique for forming a MISFET (Metal Insulator Semiconductor Field Effect Transistor) on a SOI (Silicon On Insulator) substrate that has a semiconductor substrate, an insulating layer formed on the semiconductor substrate, and a silicon layer formed on the insulating layer. This MISFET formed on the SOI substrate can reduce parasitic capacitance caused by a diffused region formed on the silicon layer. This makes it possible to achieve improvement of an operation speed and a reduction in power consumption.

Here, there are disclosed techniques listed below.
[Patent Document 1] U.S. patent Ser. No. 10/529,630 (Japanese Unexamined Patent Application Publication No. 2019-121632)
[Patent Document 2] US Patent application document No. 2020/031300 (WO 2019/097568)

For example, Patent Document 1 discloses a method of manufacturing a semiconductor device having a so-called hybrid structure provided with a SOI substrate and a bulk region. Further, Patent Document 2 discloses a technique for suppressing a leak current of a MISFET formed on an SOI region by applying a back-gate voltage to the SOI region.

SUMMARY

In the semiconductor device having the hybrid structure, miniaturization like, for example, 65 nm/55 nm generation to 45 nm/40 nm generation has been considered.

In the SOI region and the bulk region, an element separation portion is formed on the semiconductor substrate. At this time, by an etching process for forming a trench(s) for the element separation portion, a part (end) of the insulating layer is also removed. As a result, a corner portion(s) of the semiconductor substrate is exposed from the insulating layer. When an oxidation treatment is performed in a state where the corner portion of the semiconductor substrate has been exposed, the corner portion of the exposed semiconductor substrate is significantly oxidized. That is, a curvature radius of the semiconductor substrate at the oxidized corner portion becomes large, and capacity formed between the semiconductor substrate and a semiconductor layer degrades. As the miniaturization of the semiconductor device advances, a size of the insulating layer is also small, so that when the corner portion of the semiconductor substrate is oxidized as mentioned above, the above capacity further degrades, which brings deterioration of an effect(s) caused by control of the back-gate voltage. That is, a problem arises about degradation of performance of the semiconductor device.

Meanwhile, in the bulk region, an MISFET having higher withstand voltage than that of the MISFET formed on the SOI region is formed. Therefore, in the bulk region, concentration of an electric field at the corner portion of the semiconductor device easily occurs, so that if the curvature radius of the semiconductor substrate is small, a withstand voltage of a gate insulating film becomes difficult to ensure. That is, a problem arises about deterioration of reliability of the semiconductor device.

A main object of the present application is to improve the reliability of the semiconductor device having a hybrid structure and provide the technique for improving the performance of the above-mentioned semiconductor device.

The other problems and novel features of the present invention will be apparent from the description of the present specification and the accompanying drawings.

A method of manufacturing a semiconductor device according to an embodiment is a method of manufacturing a semiconductor device having a first region in which a first MISFET is to be formed and a second region in which a second MISFET is to be formed, including:

(a) preparing an SOI substrate having a semiconductor substrate, an insulating layer formed on the semiconductor substrate, and a semiconductor layer formed on the insulating layer;

(b) after the step (a), in each of the first region and the second region, forming a first insulting film on the semiconductor layer, the first insulating film being made of a material different from a material of the insulating layer;

(c) after the (b), in each of the first region and the second region, forming a mask pattern by pattering the first insulating film;

(d) after the (c), in each of the first region and the second region, forming a plurality of trenches each reaching an inside of the semiconductor substrate by performing an etching process with the mask pattern as a mask, and exposing each of a side surface of the semiconductor layer, a side surface of insulating layer and a side surface of the semiconductor substrate in an inside of each of the plurality of trenches;

(e) after the (d), in each of the first region and the second region, retreating the side surface of the insulating layer from the side surface of the semiconductor layer and the side surface of the semiconductor substrate by cleaning the inside of each of the plurality of trenches;

(f) after the (e), in each of the first region and the second region, embedding an organic film into the inside of each of the plurality of trenches;

(g) after the (f), covering the side surface of the insulating layer in the first region with the organic film and also exposing the side surface of the semiconductor layer in the first region from the organic film by performing an anisotropic etching process to the organic film in the first region;

(h) after the (g), in each of the first region and the second region, approaching each of the side surface of the semiconductor layer in the first region and the side surface of the semiconductor substrate in the first region to the side surface of the insulating layer in the first region by performing an anisotropic etching process, the isotropic etching process having a condition in which the organic film, the semiconductor layer and the semiconductor substrate are more easily etched than the insulating layer;

(i) after the (h), in each of the first region and the second region, removing the organic film;

(j) after the (i), in each of the first region and the second region, performing an oxidation treatment to each of the side surface of the semiconductor layer and the side surface of the semiconductor substrate; and (k) after the (j), in each of the first region and the second region, embedding a second insulating film into the inside of each of the plurality of trenches.

BRIEF DESCRIPTION OF THE DRAWINGS

FIG. 13 is a sectional view showing a manufacturing process following that of FIG. 12.

FIG. 14 is a sectional view showing a manufacturing process following that of FIG. 13.

DETAILED DESCRIPTION

Figure 1:
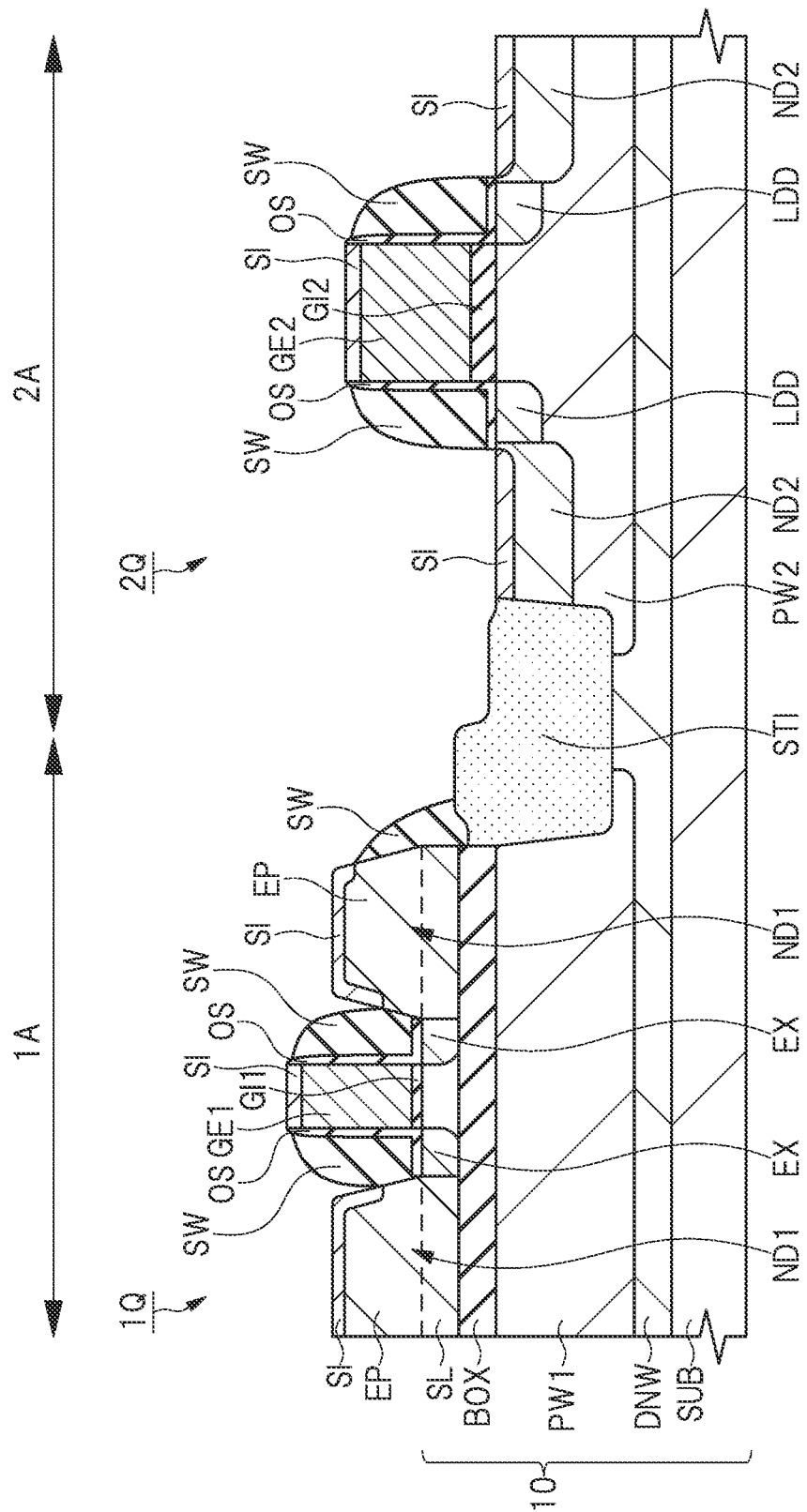
FIG. 1 is a sectional view showing a semiconductor device of a first embodiment.

Hereinafter, embodiments of the present invention will be described in detail with reference to the accompanying drawings. Note that components having the same function are denoted by the same reference characters throughout the drawings for describing the embodiments, and a repetitive description thereof will be omitted. In addition, the description of the same or similar portions is not repeated in principle unless particularly required in the following embodiments.

First Embodiment

<Structure of Semiconductor Device>

Hereinafter, a semiconductor device of a first embodiment will be described with reference to FIG. 1.

As shown in FIG. 1, a semiconductor device of a first embodiment includes a SOI substrate 10. The SOI substrate 10 has a semiconductor substrate SUB that is a supporting substrate, an insulating layer BOX formed on the semiconductor substrate SUB, and a semiconductor layer SL formed on the insulating layer BOX.

The semiconductor substrate SUB is made of, for example, p-type monocrystalline silicon. The insulating layer BOX is made of, for example, silicon oxide, and has a thickness of, for example, about 10 to 20 nm. The semiconductor layer SL is made of monocrystalline silicon, and has a thickness of, for example, about 10 to 20 nm. Incidentally, the semiconductor layer SL is an intrinsic semiconductor layer into which an n- or p-type impurities are not introduced by an ion implantation or the like. Even if the p-type impurities are introduced into the semiconductor layer SL, the impurities have a concentration of $1\times10^{13}/cm^3$ or less.

Also, the semiconductor device has a region 1A in which a MISFET 1Q is formed, and a region 2A in which a MISFET 2Q is formed. The region 1A is an SOI region in which the insulating layer BOX and the semiconductor layer SL are left, and the MISFET 1Q is a low withstand voltage MISFET that configures a logic circuit and an RAM circuit, etc. The region 2A is a bulk region from which the insulating layer BOX and the semiconductor layer SL are removed, and the MISFET region 2Q is a high withstand voltage MISFET that configures an I/O circuit etc.

Incidentally, in the first embodiment, described as a representative example of the MISFET will be an n-type MISFET 1Q and an n-type MISFET 2Q. However, in another region of the semiconductor device, a p-type MISFET is also formed.

A plurality of element isolation portions STI is formed in the semiconductor device including a boundary portion etc. between the region 1A and the region 2A. An element isolation portion STI in the region 1A is configured by a trench formed in the SOI substrate 10 and an insulating film embedded into the trench. An element isolation portion STA in the region 2A is configured by a trench formed in the semiconductor substrate SUB and an insulating film embedded into the trench.

In the region 1A and the region 2A, an n-type well region DNW is formed on the p-type semiconductor substrate SUB. An p-type well region PW1 is formed in the well region DNW of the region 1A, and an p-type well region PW2 is formed in the well region DNW of the region 2A. By this well region DNW, the well region PW1 and the well region PW2 are electrically separated from the semiconductor substrate SUB.

On a surface of the well region PW1 contacting the insulating layer BOX, a p-type ground plane region that has higher concentration than that of the well region PW1 is formed. However, here, the ground plane region is omitted in figure. The well region PW1 is a region to which a voltage different from that of a gate electrode GE1 is applied, and is a region for suppressing a drive current of the MISFET 1Q together with the gate electrode GE1. That is, the well region OW1 functions as a back-gate electrode of the MISFET 1Q.

Above the semiconductor layer SL in the region 1A, the gate electrode GE1 is formed via a gate insulating film GI1. The gate insulating film GI1 is an insulating film such as a silicon oxide film. The gate electrode GE1 is a conductive film such as a polycrystalline silicon film.

On both side surfaces of the gate electrode GE1, sidewall spacers SW are formed via an insulating film OS. On the semiconductor layer SL under the insulating film OS and the sidewall spacers SW, an extension region EX that is an n-type impurity region having low concentration is formed. Further, at a part on the semiconductor layer SL, an epitaxial layer EP is formed. In the epitaxial layer EP and the semiconductor layer SL, diffusion regions ND1, each of which is an n-type impurity region having higher concentration than that of the extension region EX, are formed. The extension region EX and the diffusion regions ND1 configure a source regia drain region of the MISFET 1Q.

Above the semiconductor substrate SUB in the region 2A, a gate electrode GE1 is formed via a gate insulating film GI2. The gate insulating film GI2 is made of an insulating film such as a silicon oxide film. Incidentally, a thickness of the gate insulating film GI2 is larger than a thickness of the gate insulating film GI1, and the gate electrode GE2 is made of the same material as that of the gate electrode GE1.

On both side surfaces of the gate electrode GE2, sidewall spacers SW are formed via the insulating film OS. Above the semiconductor substrate under the insulating film OS and the sidewall spacers SW, diffusion regions ND2, each of which is an n-type impurity region having higher concentration than that of the impurity region LDD, are formed. Those impurity regions LDD and diffusion regions ND2 configure a source region or a drain region of the MISFET 20.

On an upper surface of each of the gate electrode GE1, gate electrode GE2, diffusion region ND1, and diffusion region ND2, a silicide layer SI is formed. The silicide layer SI is made of, for example, nickel silicide (NiSi) or cobalt silicide ($CoSi_2$).

<Method of Manufacturing Semiconductor Device (Forming Step of Element Isolation Portion STI)

Hereinafter, a method of manufacturing a semiconductor device of a first embodiment will be described with reference to FIGS. 2 to 21. FIGS. 2 to 12 mainly show steps until the element isolation portion STI is formed on the SOI substrate 10. FIGS. 15 to 21 mainly show steps until the MISFET 1Q is formed in the region 1A and the MISFET 2Q is formed in the region 2A. Main features of the present application are a process from forming the trench TR in the SOI substrate 10 to embedding the insulating film into the trench TR and forming the element isolation portion STI. FIGS. 13 and 14 are sectional views for explaining the features in details.

Figure 2:
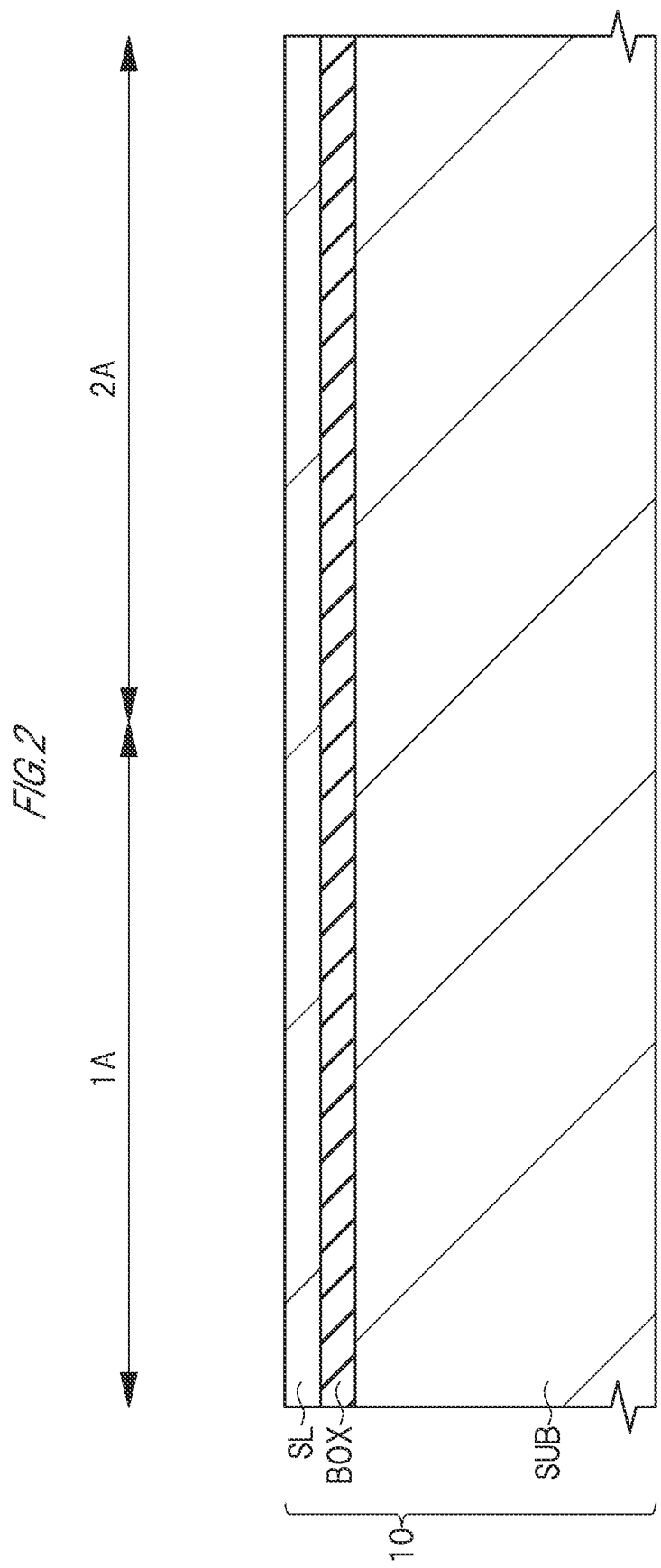
FIG. 2 is a sectional view showing a manufacturing process of the semiconductor device of the first embodiment.

First, as shown in FIG. 2, prepared is an SOI substrate 10 that has a semiconductor substrate SUB, an insulating layer BOX formed on the semiconductor substrate SUB, and a semiconductor layer SL formed on the insulating layer BOX. Such an SOI substrate 10 is formed by, for example, a bonding method. In the bonding method, for example, bonding is performed by oxidizing a surface of a first semiconductor substrate made of silicon to form the insulating layer BOX, and then crimping a second semiconductor substrate made of silicon on the first semiconductor substrate under high temperature. Thereafter, the second semiconductor substrate is thinned. In this case, a thin film of the second semiconductor substrate remaining on the insulating layer BOX becomes a semiconductor layer SL, and the first semiconductor substrate under the insulating layer BOX becomes a semiconductor substrate SUB.

Figure 3:
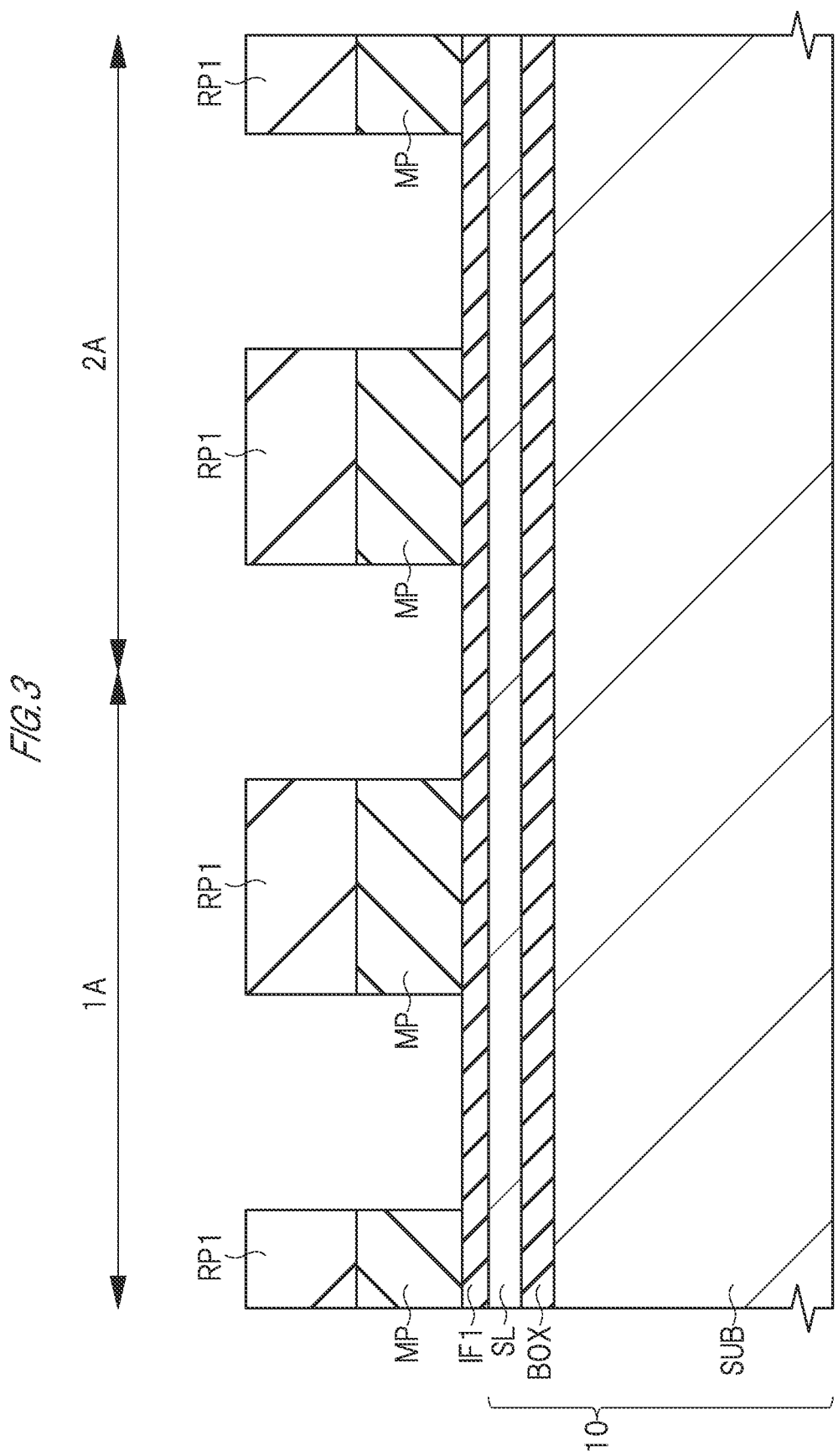
FIG. 3 is a sectional view showing a manufacturing process following that of FIG. 2.

As shown in FIG. 3, in the region 1A and the region 2A, an insulating film IF1 made of, for example, a silicon oxide film is formed on the semiconductor layer SL by, for example, a CVD method. Then, in the region 1A and the region 2A, an insulating film made of, for example, a silicon nitride film is formed on the insulating film IF1 by, for example, a CVD method. This insulating film is made of a material different from those of the insulating layer BOX and the insulating film IF1. Next, a resist pattern RP1 is formed on the insulating film. Then, a dry etching process is performed to the insulating film by using the resist pattern RP1 as a mask, and the insulating film is patterned. By this way, a mask pattern MP is formed. Incidentally, the insulating film IF1 has a thickness of about 5 to 15 nm, and the mask pattern MP has a thickness of about 80 to 100 nm.

Figure 4:
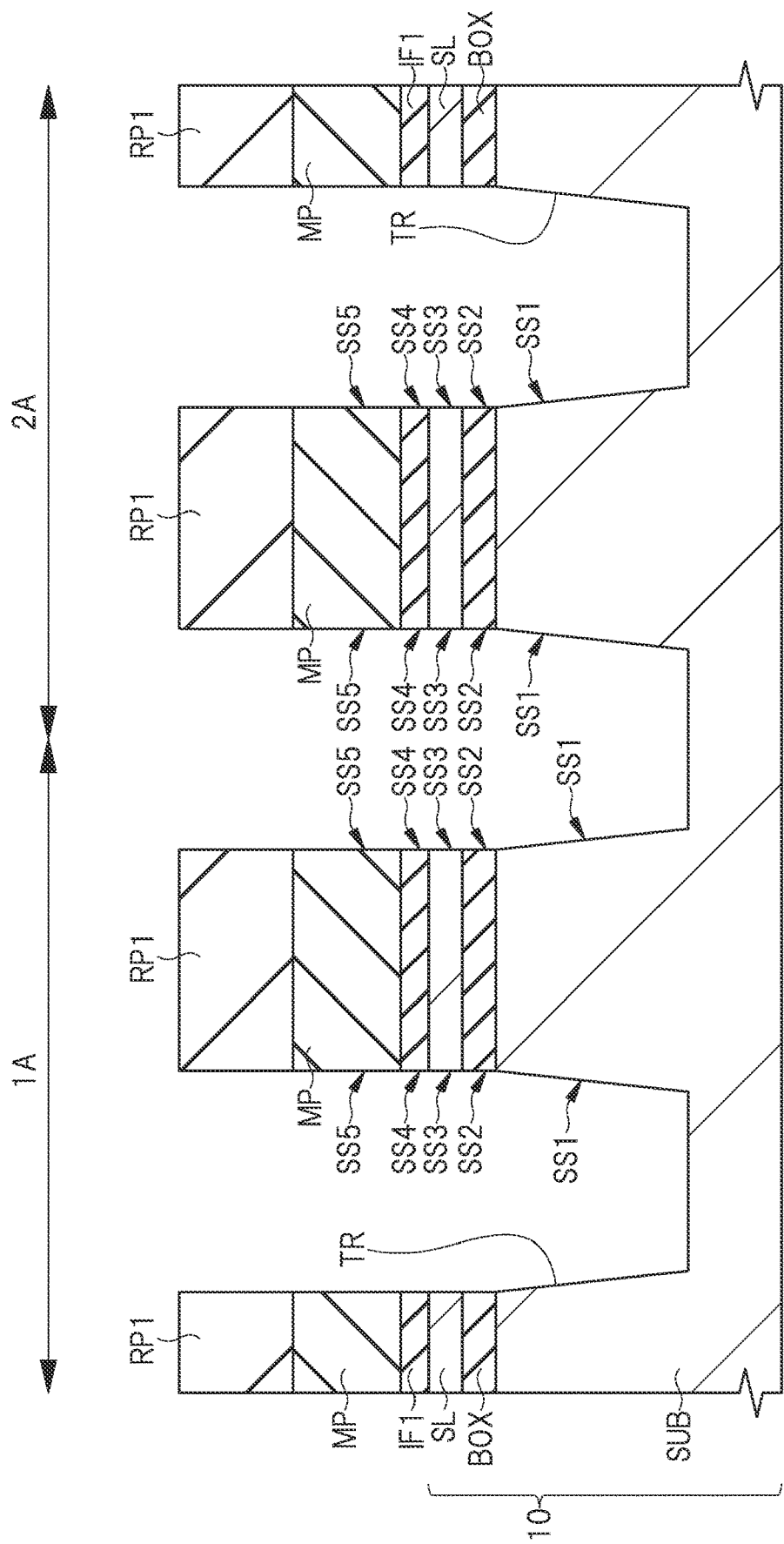
FIG. 4 is a sectional view showing a manufacturing process following that of FIG. 3.

As shown in FIG. 4, in the region 1A and the region 2A, a dry etching process is performed by using the resist pattern RP1 and the mask pattern MP as masks, and a plurality of trenches TR that reaches an inside of the semiconductor substrate SUB are formed in the SOI substrate 10. By this way, a side surface SS5 of the mask pattern MP, a side surface SS4 of the insulating film IG1, a side surface SS3 of the semiconductor layer SL, a side surface of the insulating layer BOX, and a side surface SS1 of the semiconductor substrate SUB are exposed in the inside of each of the plurality of trenches TR. Then, the resist pattern RP1 is removed by an ashing treatment.

Figure 5:
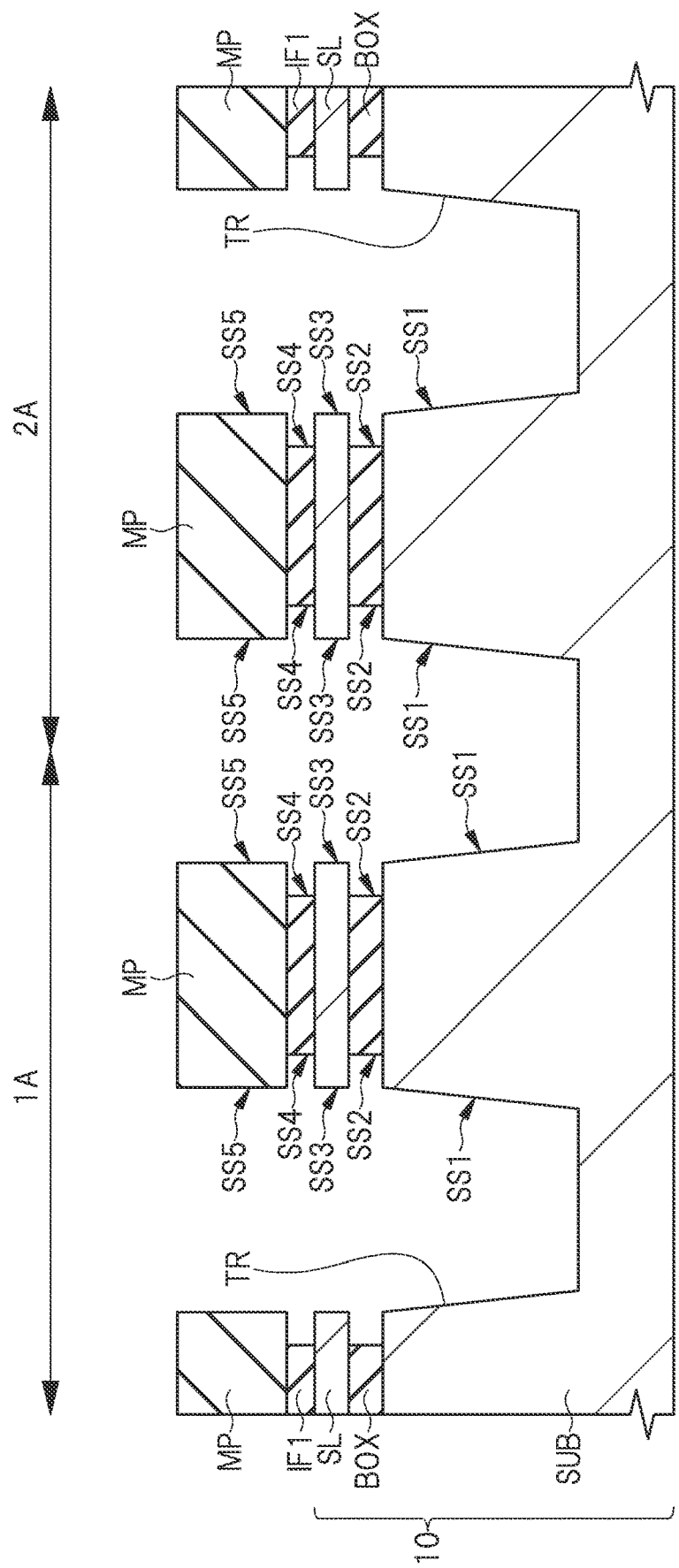
FIG. 5 is a sectional view showing a manufacturing process following that of FIG. 4.

As shown in FIG. 5, in the region 1A and the region 2A, the inside of each of the plurality of trenches TR is cleaned. This cleaning means an isotropic etching process, and uses an aqueous solution containing hydrofluoric acid. Consequently, the insulating film IF1 and the insulating layer BOX are etched. That is, the side surface SS4 of the insulating film IF1 and the side surface SS2 of the insulating layer BOX retreats from the side surface SS3 of the semiconductor layer SL and the side surface SS1 of the semiconductor substrate SUB.

Figure 6:
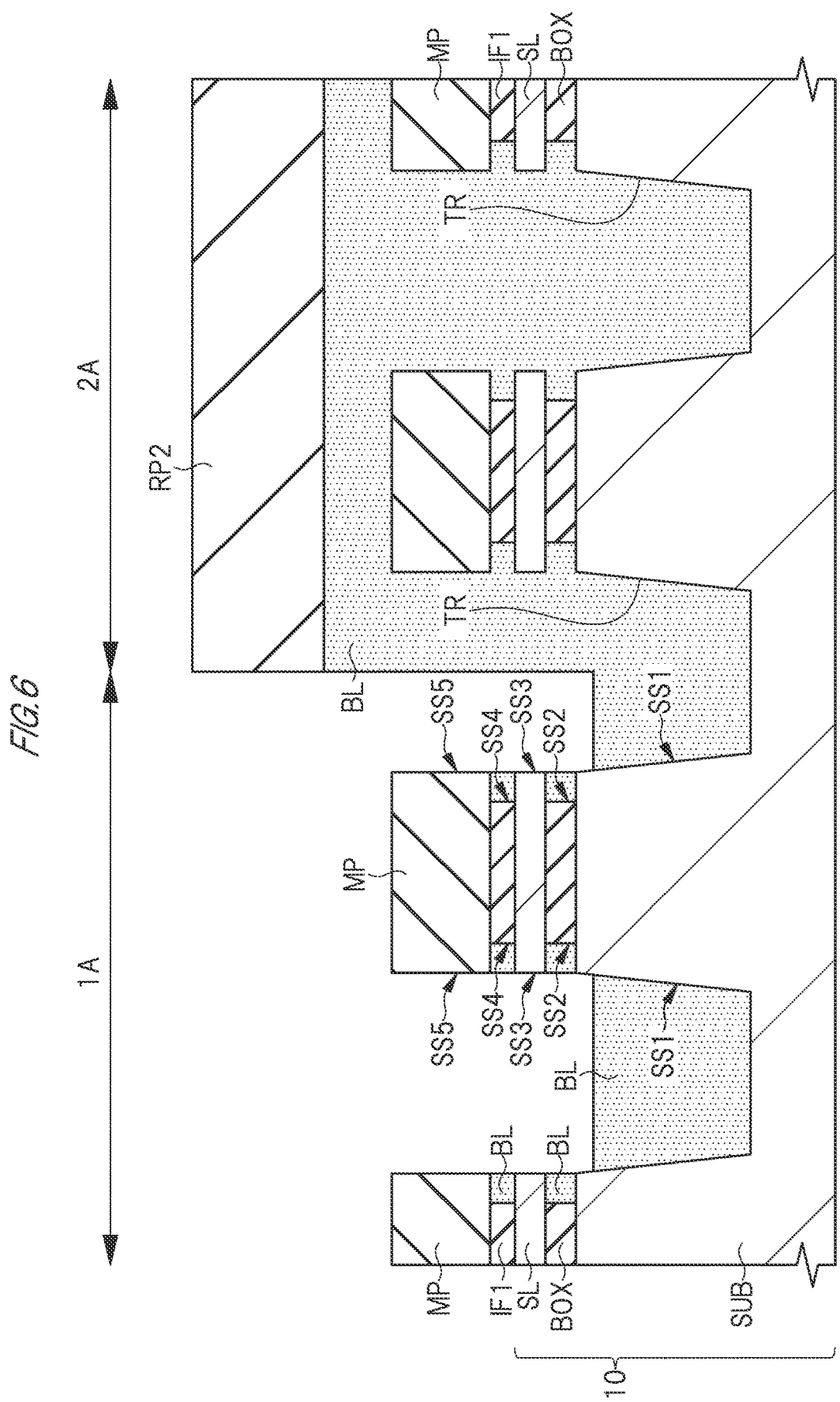
FIG. 6 is a sectional view showing a manufacturing process following that of FIG. 5.

As shown in FIG. 6, in the region 1A and the region 2A, an organic film BL is embedded into the plurality of trenches TR so as to cover the mask pattern MP. The organic film BL is made of a non-photosensitive resin material, and is formed by a coating method. Next, on the organic film BL in the region 2A, a resist pattern RP2 having a pattern(s) for opening the region 1A is formed.

Next, an anisotropic etching process is performed to the organic film BL in the region 2A by using the resist pattern RP2 as a mask. The side surface SS4 of the insulating film IF1 in the region 1A and the side surface SS2 of the insulating layer BOX in the region 1A are covered with the organic film BL, and the side surface SS3 of the semiconductor layer SL in the region 1A is exposed from the organic film BL. Further, the anisotropic etching process may be slightly over-etching so that a part of the side surface SS1 of the semiconductor substrate SUB in the region 1A is also exposed from the organic film BL.

Figure 7:
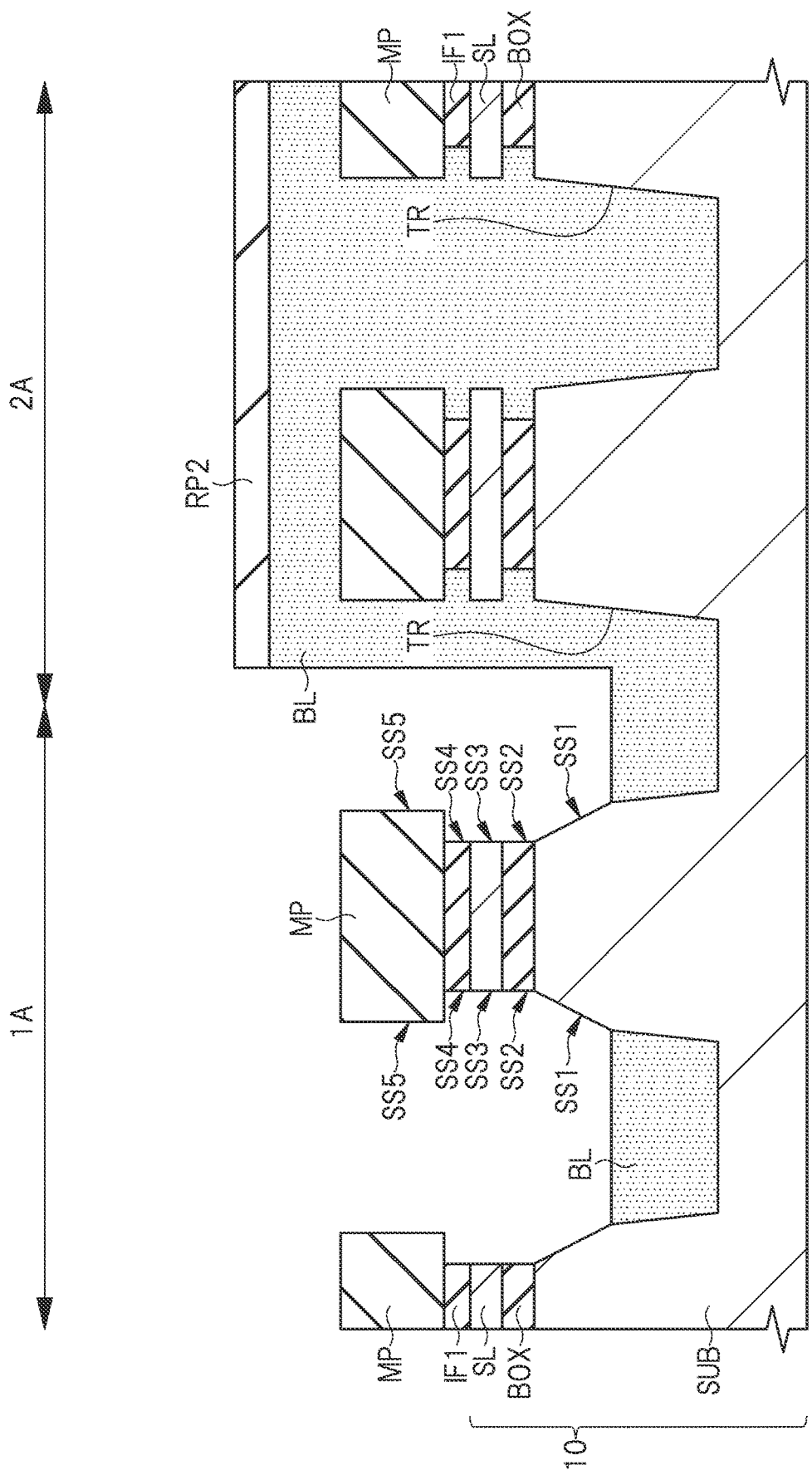
FIG. 7 is a sectional view showing a manufacturing process following that of FIG. 6.

As shown in FIG. 7, in the region 1A and the region 2A, an isotropic etching, which has such a condition as to be more easily etched than those of the insulating layer BOX and the mask pattern MP, is performed to the organic BL, the semiconductor layer SL, and the semiconductor substrate SUB. Consequently, the semiconductor layer SL and the semiconductor substrate SUB are etched together with the organic film BL. That is, the side surface SS3 of the semiconductor layer SL in the region 1A and the side surface SS1 of the semiconductor substrate SUB in the region 1A approach the side surface SS2 of the insulating layer BOX in the region 1A and the side surface SS4 of the insulating film IF1 in the region 1A. Preferably, respective positions of the side surfaces SS2 to SS4 are coincide. Incidentally, the side surface SS1 of the semiconductor substrate SUB is close to the respective positions of the side surfaces SS2 to SS4 in the vicinity of an upper surface of the semiconductor substrate SUB, but generally inclines toward a bottom portion of the trench TR and becomes a taper shape.

Also, during the isotropic etching process, the side surface SS4 of the insulating film IF1 in the region 2A, the side surface SS3 of the semiconductor layer SL in the region 2A, the side surface SS2 of the insulating layer BOX in the region 2A, and the side surface SS1 of the semiconductor substrate SUB in the region 2A are covered with the organic film BL in the region 2A. Consequently, in the region 2A, the insulating film IF1, the semiconductor layer SL, the insulating layer BOX, and the semiconductor substrate SUB are not etched. Further, the resist pattern is also etched, but the resist pattern RP2 may be removed as long as the organic film BL is left so as to cover the side surface SS2 to SS4 in the region 2A.

After the above isotropic etching process, the organic film BL left in the region 1A and the region 2A, and the resist pattern RP2 are removed by an ashing treatment. Then, the cleaning is performed to the inside of each of the plurality of trenches TR.

Figure 8:
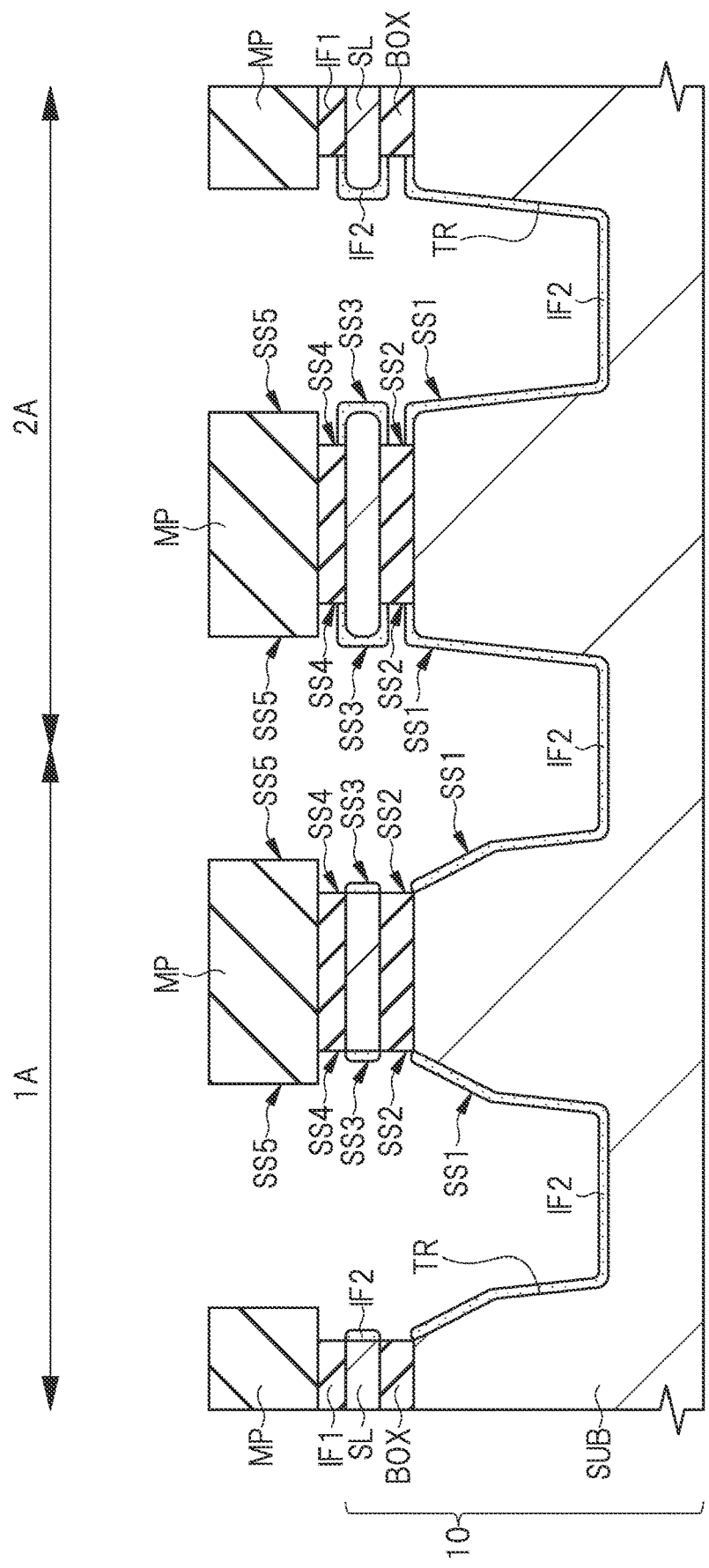
FIG. 8 is a sectional view showing a manufacturing process following that of FIG. 7.

As shown in FIG. 8, in the region 1A and the region 2A, an oxidation treatment is performed to the side surface SS3 of the semiconductor layer SL and the side surface SS1 of the semiconductor substrate SUB. Thus, an insulating film IF2 is formed on the side surface SS3 of the semiconductor layer SL and the side surface SS1 of the semiconductor substrate SUB. Further, in the region 2A, the oxidation treatment is performed to a part of an upper surface of the semiconductor substrate SUB in a state of being exposed from the insulating layer BOX, so that an insulating film IF2 is also formed on the part of the upper surface of the semiconductor substrate SUB.

Figure 9:
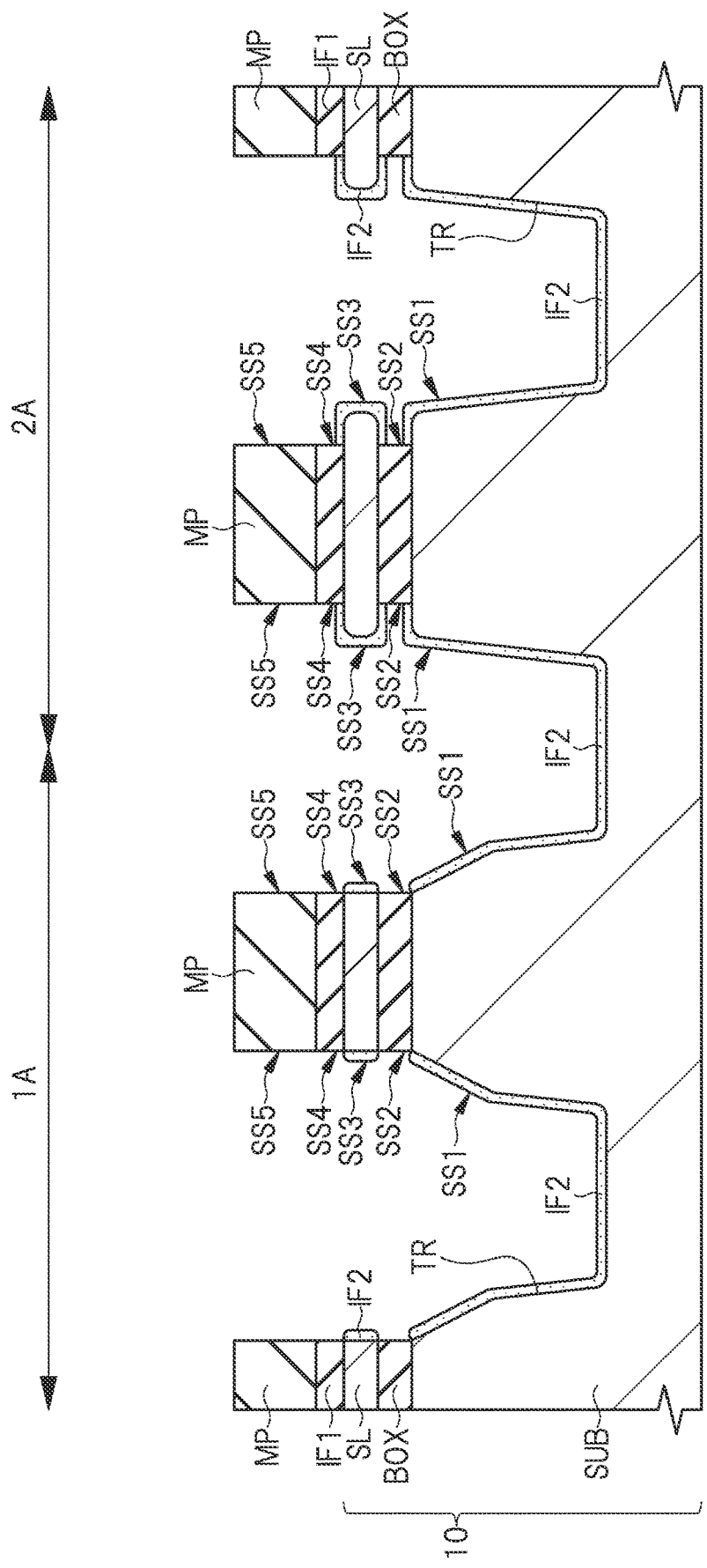
FIG. 9 is a sectional view showing a manufacturing process following that of FIG. 8.

As shown in FIG. 9, in the region 1A and the region 2A, the isotropic etching process that uses an aqueous solution containing a phosphonic acid is performed to the mask pattern MP. Thus, the mask pattern MP is wholly etched, and the side surface SS5 of the mask pattern MP approaches the side surface SS2 of the insulating layer BOX, the side surface SS3 of the semiconductor layer SL, and the side surface SS4 of the insulating film IF1.

Figure 10:
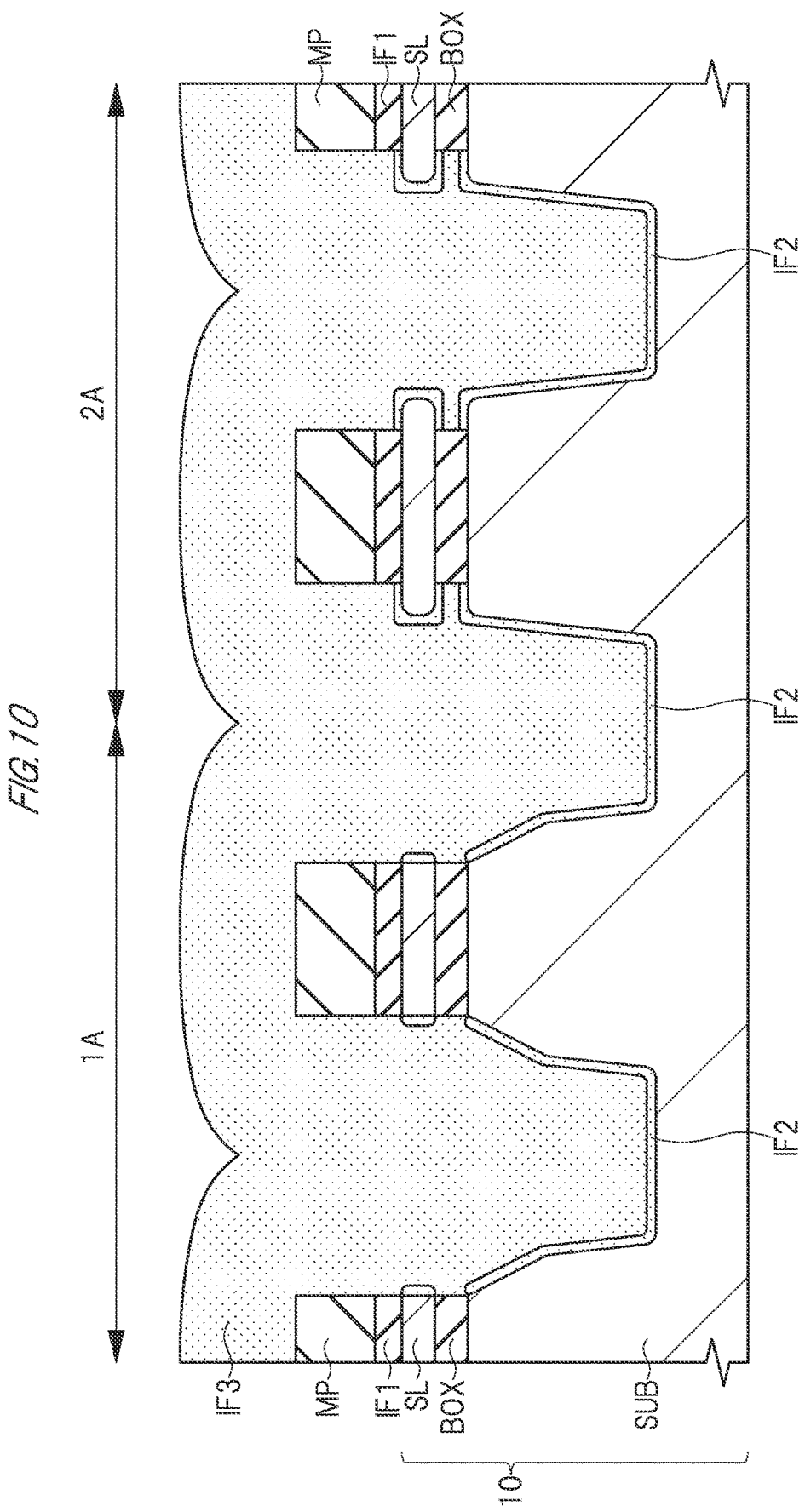
FIG. 10 is a sectional view showing a manufacturing process following that of FIG. 9.

As shown in FIG. 10, in the region 1A and the region 2A, an insulating film IF3 made of, for example, a silicon oxide film is formed on the mask pattern MP by, for example, a CVD method so as to embed the inside of each of the plurality of trenches TR. Next, a thermal treatment (densify anneal) at about 600 to 800° C. is performed to the insulating film IF3, thereby causing a film quality of the insulating film IF3 to harden. Incidentally, the insulating film IF2 and the insulating film IF3 are embedded, as an integrated insulating film, into the plurality of trenches TR. However, here, to easily understand the present invention, they are divided and illustrated.

Figure 11:
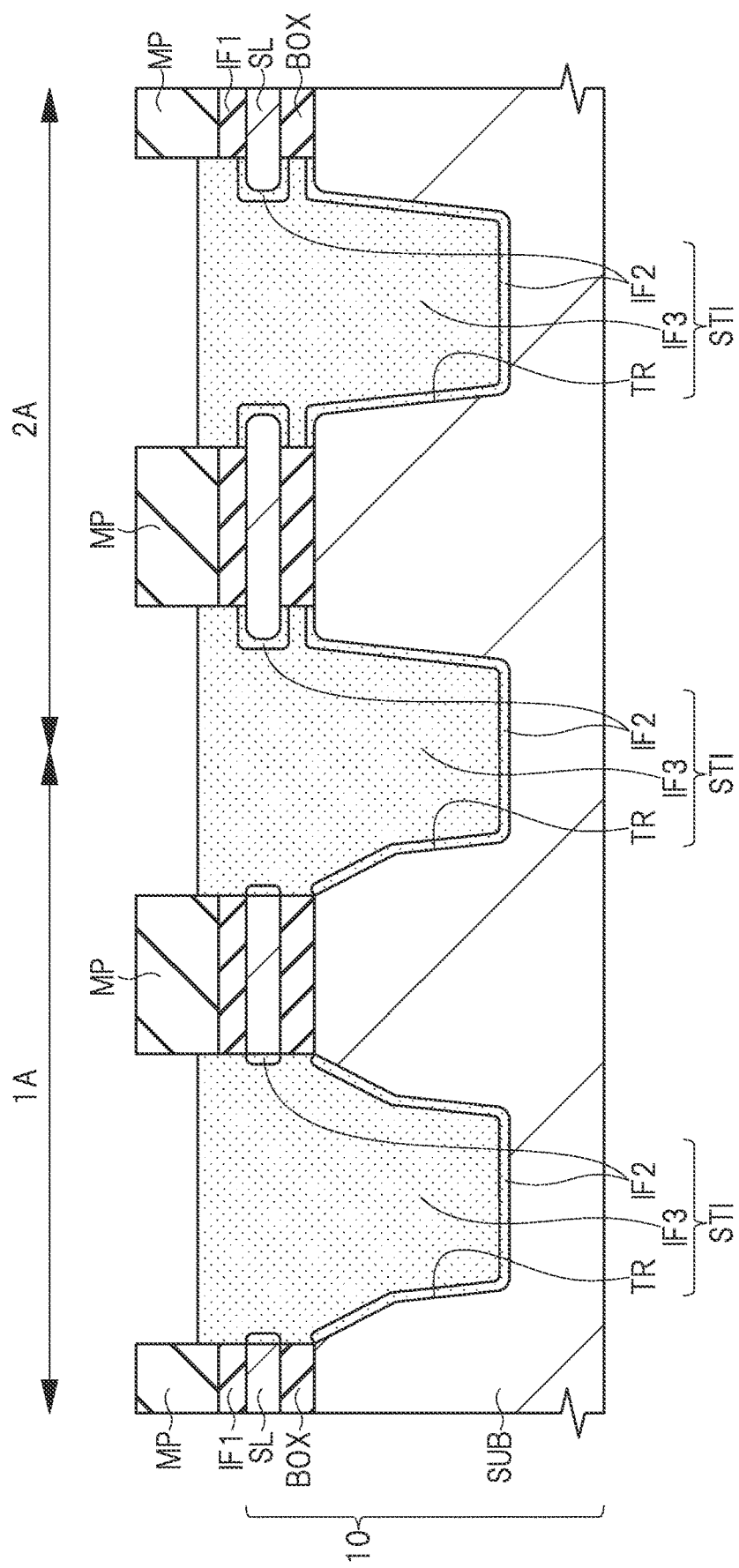
FIG. 11 is a sectional view showing a manufacturing process following that of FIG. 10.

As shown in FIG. 11, in the region 1A and the region 2A, the insulating film IF3 formed on the mask pattern MP is removed by a CMP method. Next, by performing an isotropic etching process that uses an aqueous solution containing hydrofluoric acid, a position of the upper surface of the insulating film IF3 is caused to retreat. Consequently, the element isolation portion STI that is configured by the trenches TR and the insulating film IF3 and the insulating film IF2 embedded into the insides of the trenches TR is formed.

Figure 12:
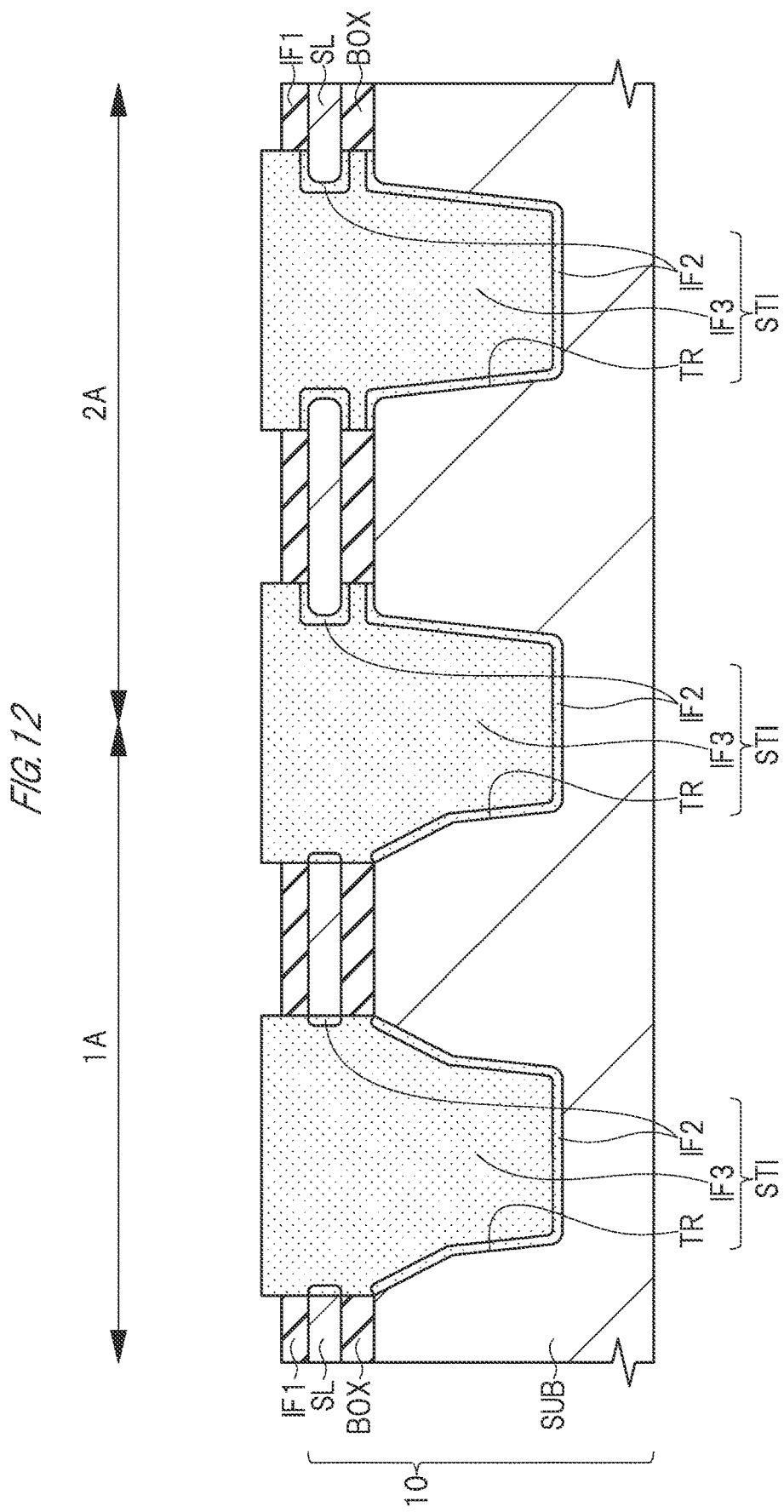
FIG. 12 is a sectional view showing a manufacturing process following that of FIG. 11.

As shown in FIG. 12, in the region 1A and the region 2A, by performing an isotropic etching process that uses an aqueous solution containing phosphonic acid, the mask pattern MP is removed.

Main Features of First Embodiment

Hereinafter, main features of the first embodiment will be described with reference to FIGS. 13 and 14 as comparing with a comparative example that has been examined by the inventor(s) of the present application.

As shown in FIG. 13, the isotropic etching process of FIG. 7 is not performed to a region 1A of a comparative example. Therefore, the oxidation treatment of FIG. 9 is performed in states where the semiconductor layer SL protrudes from the insulating layer BOX and the insulating film IF and a part of the upper surface of the semiconductor substrate SUB is exposed from the insulating layer BOX. At such locations, a corner portion(s) is easily oxidized particularly, so that the insulating film IF2 easily thickens and the semiconductor layer SL easily thins.

In other words, in the comparative example, since the part of the upper surface of the semiconductor substrate SUB is also oxidized, a curvature radius R1 becomes large in size at the corner portion configured by the side surface SS1 of the semiconductor substrate SUB and the upper surface of the semiconductor substrate SUB. The curvature radius is, for example, 20 to 30 nm.

Therefore, considering capacity formed between the semiconductor substrate SUB and the semiconductor layer SL, a value of capacity C1 in the vicinity of the MISFET 1Q and a value of capacity C2 in the vicinity of the element isolation portion STI easily have a different value. Specifically, the value of the capacity C2 becomes smaller than the value of the capacity C1, which brings a reduction in overall capacity values. If so, an effect due to control of a back-gate voltage leads to being reduced.

Meanwhile, in the region 1A of the first embodiment, by the isotropic etching process of FIG. 7, the side surface SS3 of the semiconductor layer SL and the side surface SS1 of the semiconductor substrate SUB are approaching the side surface SS2 of the insulating layer BOX. Thus, the value of capacity C3 in the vicinity of the element isolation portion STI becomes almost the same as the value of the capacity C1. Therefore, since the effect due to the control of the back-gate voltage can be enhanced, performance of the semiconductor device can be improved. Further, in the region 1A of the first embodiment, the semiconductor layer SL has hardly a protruding portion(s) and the upper surface of the semiconductor substrate SUB is hardly oxidized, either, so that a curvature radius R2 becomes smaller than the curvature radius R1, and is, for example, 5 to 10 nm.

Figure 16:
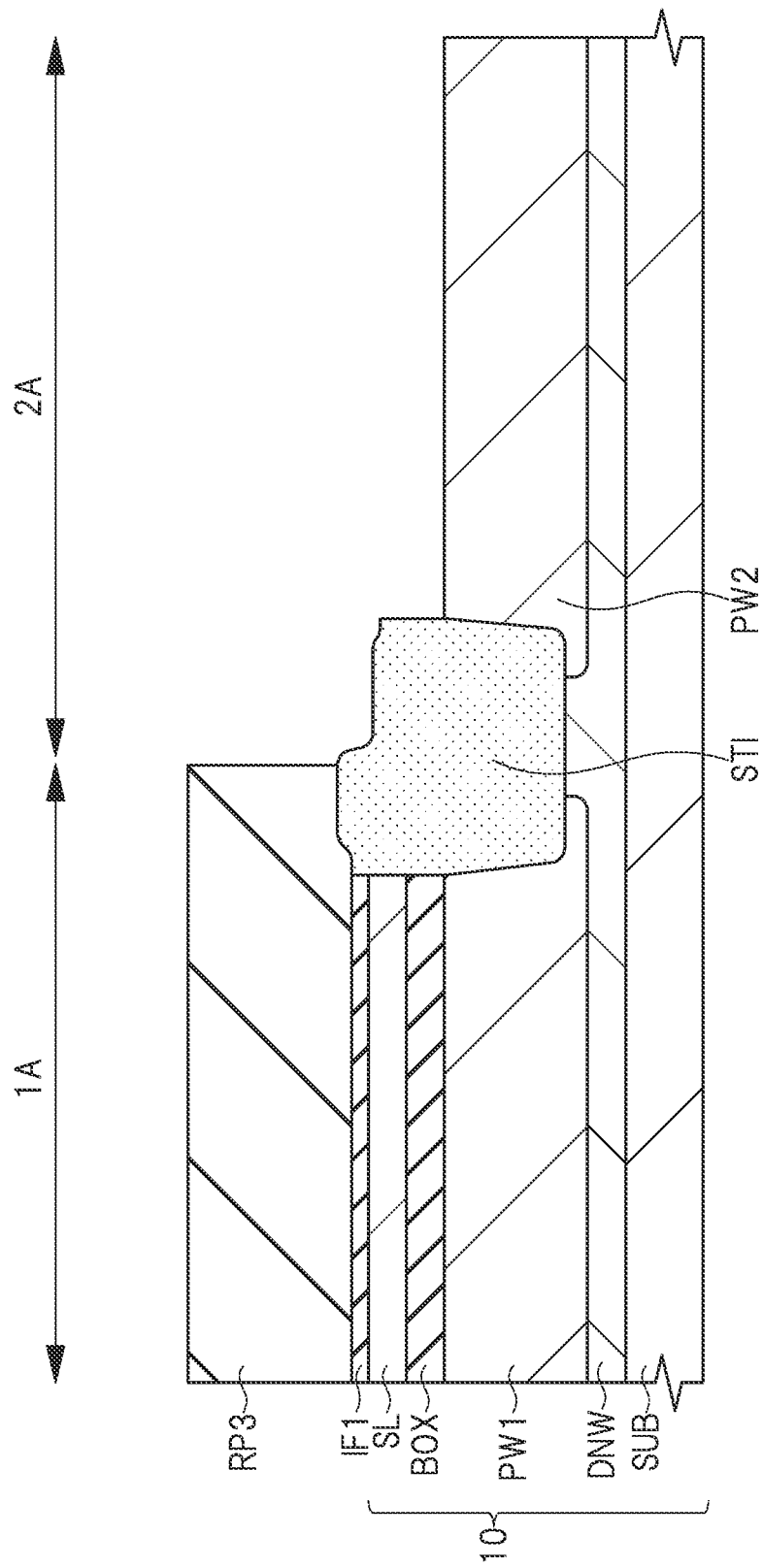
FIG. 16 is a sectional view showing a manufacturing process following that of FIG. 15.

Here, in the respective regions 2A (bulk regions) of the first embodiment and the comparative example, after finishing the same steps as steps performed to the region 1A of a comparative example 1, the semiconductor layer SL and the insulating layer BOX are removed as shown in FIG. 16 described later. Therefore, a curvature radius R3 of the region 2A is almost the same as the curvature radius R1, and becomes larger than the curvature radius R2. In the MISFET 2Q formed in the region 2A, the larger curvature radius R3 can relax electric field concentration caused by the corner portion of the semiconductor substrate SUB, so that the withstand value of the gate insulating film GI2 can easily be ensured. Therefore, the reliability of the semiconductor device can be improved.

Further, it has been understood from the examination by the inventor of the present application that when the semiconductor layer SL has a thin portion (s) in thickness like the comparative example, there is a tendency to a reduction in a current amount at such a thin portion. In addition, it has also been understood from the examination by the inventor of the present application that, like FIG. 19 described later, the epitaxial layer EP is formed on the semiconductor layer SL, but if the semiconductor layer SL becomes too much thin in thickness, aggregation of silicon easily occurs. Therefore, if the semiconductor layer SL has any thin portions in thickness like the comparative example, the portions easily become a base point of the aggregation of silicon.

In the first embodiment relative to these, since the thickness of the semiconductor layer SL becomes nearly uniform, the reduction in the current amount like the comparative example can be suppressed and the occurrence of the aggregation of silicon can also be suppressed.

FIG. 14 shows a difference between the first embodiment and the comparative example about the step (step of embedding the insulating film IF3 into the trench TR) of FIG. 10.

To embed the insulating film IF3 well, an aspect ratio needs to be ameliorated. Therefore, as described in FIG. 9, the isotropic etching process is performed to the mask pattern MP, which makes a width of an upper portion of each trench TR wide and makes the insulating film IF3 easily embedded therein. However, in the comparative example, the side surface SS3 of the semiconductor layer SL is not retreated, so that a width W2 between a pair of semiconductor layers SL that are located at both sides of the trench TR becomes narrow. Therefore, a void(s) 50 may occur during deposition of the insulating film IF3. That is, if there are such locations as to become concave portions like the comparative example, blockages occur first at locations having no concave portions when the insulating film IF3 is isotropically embedded, so that the voids 50 is likely to be formed at the concave portions. If such voids 50 occur, a problem arises about a conductive substance, moisture, or the like remaining inside the voids 50 in a later step and about a defect being caused.

In the first embodiment relative to this, the side surface SS3 of the semiconductor layer SL is retreated by the step of FIG. 7. Thus, the width W1 between the pair of semiconductor layers SL becomes wider (larger) than the width W2. Therefore, the aspect ratio is improved, and the occurrence of the voids 50 like the comparative example can be suppressed. Consequently, since the occurrence of defects can be suppressed, the reliability of the semiconductor device can be improved.

Incidentally, such an aspect ratio becomes particularly severe in the region 1A where a memory cell such as an SRAM circuit is formed. Further, as a matter of course, the aspect ratio becomes stricter as the miniaturization is promoted. Therefore, applying the technique of the first embodiment makes it possible to contribute to the promotion of the miniaturization.

<Method of Manufacturing Semiconductor Device (Forming Step of MISFETs 1Q, 2Q)>

Hereinafter, steps of forming the MISFET 1Q in the region 1A and forming the MISFET 2Q in the region 2A will be described below with reference to FIGS. 15 to 21. Incidentally, in FIGS. 15 to 21, the element isolation portion STI is shown in a simplified manner.

Figure 15:
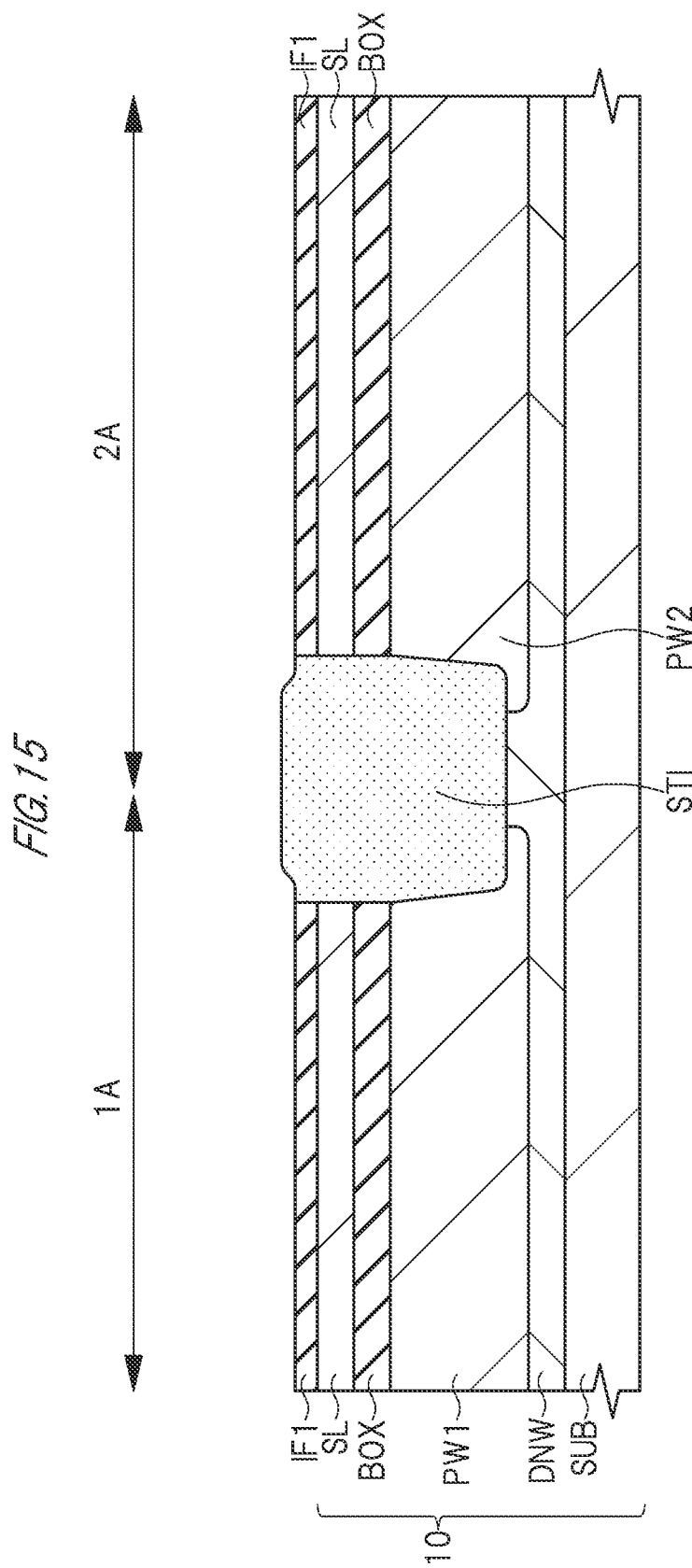
FIG. 15 is a sectional view showing a manufacturing process following that of FIG. 14.

FIG. 15 shows a manufacturing step following FIG. 12. As shown in FIG. 15, first, in the region 1A and the region 2A, an n-type well region DNW is formed on the semiconductor substrate SUB by a photolithography method and an ion implantation method. Next, an p-type well region PW1 is formed in the well region DNW of the region 1A by the photolithography method and the ion implantation method, and an p-type well region PW2 is formed in the well region DNW of the region 2A. Incidentally, Since the resist pattern is removed and the subsequent cleaning is performed in these ion implantation steps, each surface of the element isolation portion STI and the insulating film IF1 is slightly retreated.

Next, a resist pattern PR3 that covers the region 1A and opens the region 2A is formed. Then, by performing an etching process using the resist pattern PR3 as a mask, the insulating film IF1, the semiconductor layer SL, and the insulating layer BOX in the region 2A are sequentially removed. Thus, as shown in FIG. 16, the semiconductor substrate SUB in the region 2A is exposed. Here, in a step of removing the insulating film IF1 and the insulating layer BOX, an aqueous solution containing hydrofluoric acid is used. Consequently, the surface of the element isolation portion STI in the region 2A retreads. Thereafter, the resist pattern RP3 is removed by an ashing treatment.

Figure 17:
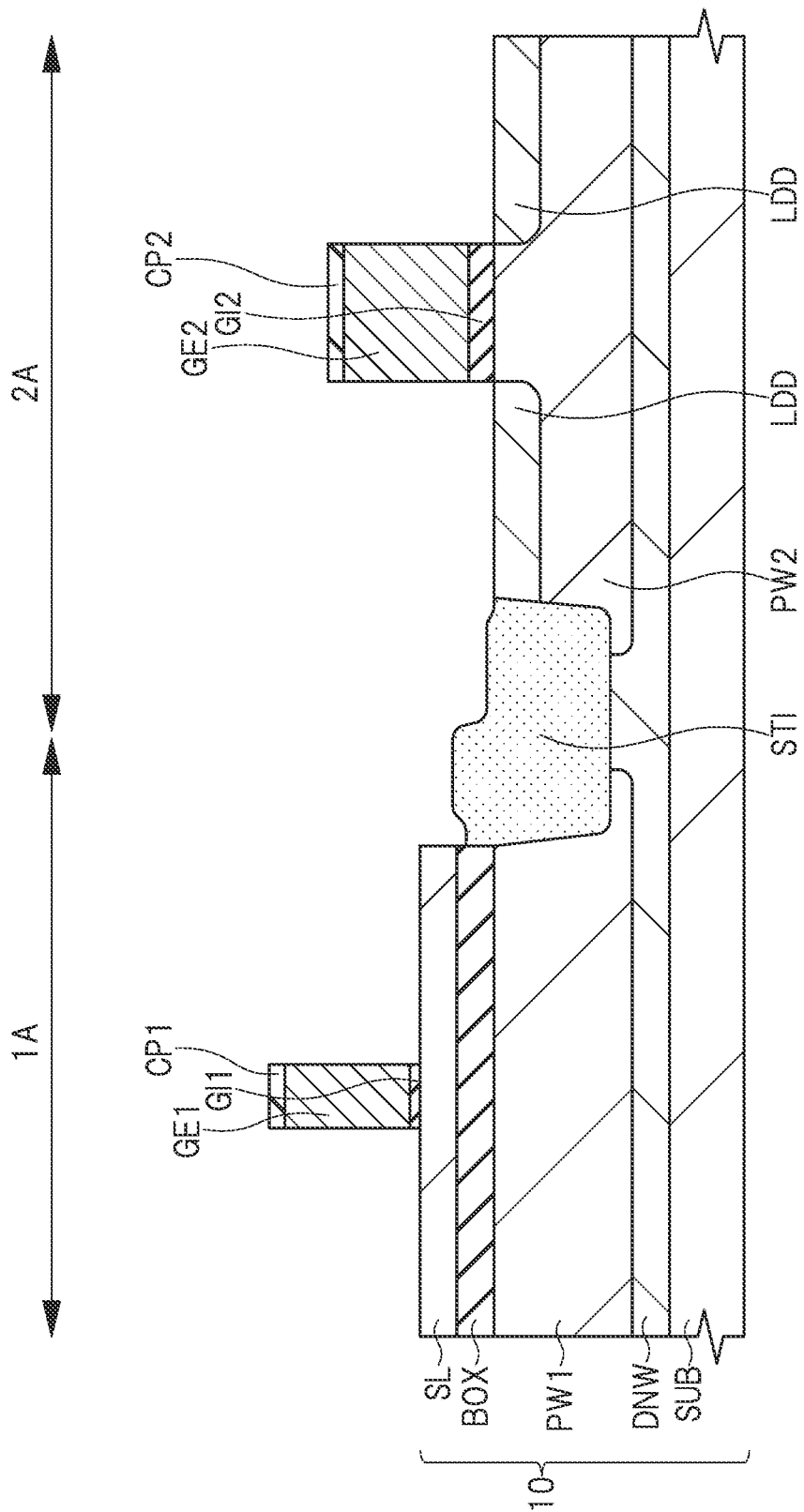
FIG. 17 is a sectional view showing a manufacturing process following that of FIG. 16.

Next, as shown in FIG. 17, a gate insulating film GI1, a gate electrode GE1, and a cap film CP1 are formed in the region 1A, and a gate insulating film GI2, a gate electrode GE2, and a cap film CP2 are formed in the region 2A. First, a gate insulating film GI2 made of, for example, a silicon oxide film is formed on the semiconductor substrate SUB of the region 2A by, for example, a thermal oxidation method. The gate insulating film GI2 has a thickness of about 5 to 8 nm. At this time, the semiconductor layer SL in the region 1A is also slightly oxidized, and the thickness of the insulating film IF1 is increased. Next, the insulating film IF1 in the region 1A is selectively removed by a photolithography method and a wet etching process to expose the semiconductor layer SL in the region 1A.

Next, a gate insulating film GI1 made of, for example, a silicon oxide film is formed on the semiconductor layer SL of the region 1A by, for example, a thermal oxidation method. A thickness of the gate insulating film GI1 is thinner (smaller) than a thickness of the gate insulating film GI2, and is about 2 to 4 nm.

Next, a conductive film such as an n-type polycrystalline silicon film is formed on the gate insulating film GI1 in the region 1A and on the gate insulating film GI2 in the region 2A by, for example, a CVD method. Next, for example, a silicon nitride film is formed on the conductive film by, for example, a CVD method. Next, in the region 1A and the region 2A, the silicon nitride film and the conductive film are patterned by a photolithography method and a dry etching process. Consequently, the gate electrode GE1 and the cap film CP1 located on the gate electrode GE1 are formed on the gate insulating film GI1, and the gate electrode GE2 and the cap film CP1 located on the gate electrode GE2 are formed on the gate insulating film GI2.

Next, the gate insulating film GI1 exposed from the gate electrode GE1 in the region 1A, and the gate insulating film GI2 exposed from the gate electrode GE2 in the region 2A are removed by a wet etching process. Consequently, as shown in FIG. 17, the gate insulating film GI1, the gate electrode GE1, and the cap film CP1 are formed in the region 1A, and the gate insulating film GI2, the gate electrode GE2, and the cap film CP2 are formed in the region 2A.

Figure 18:
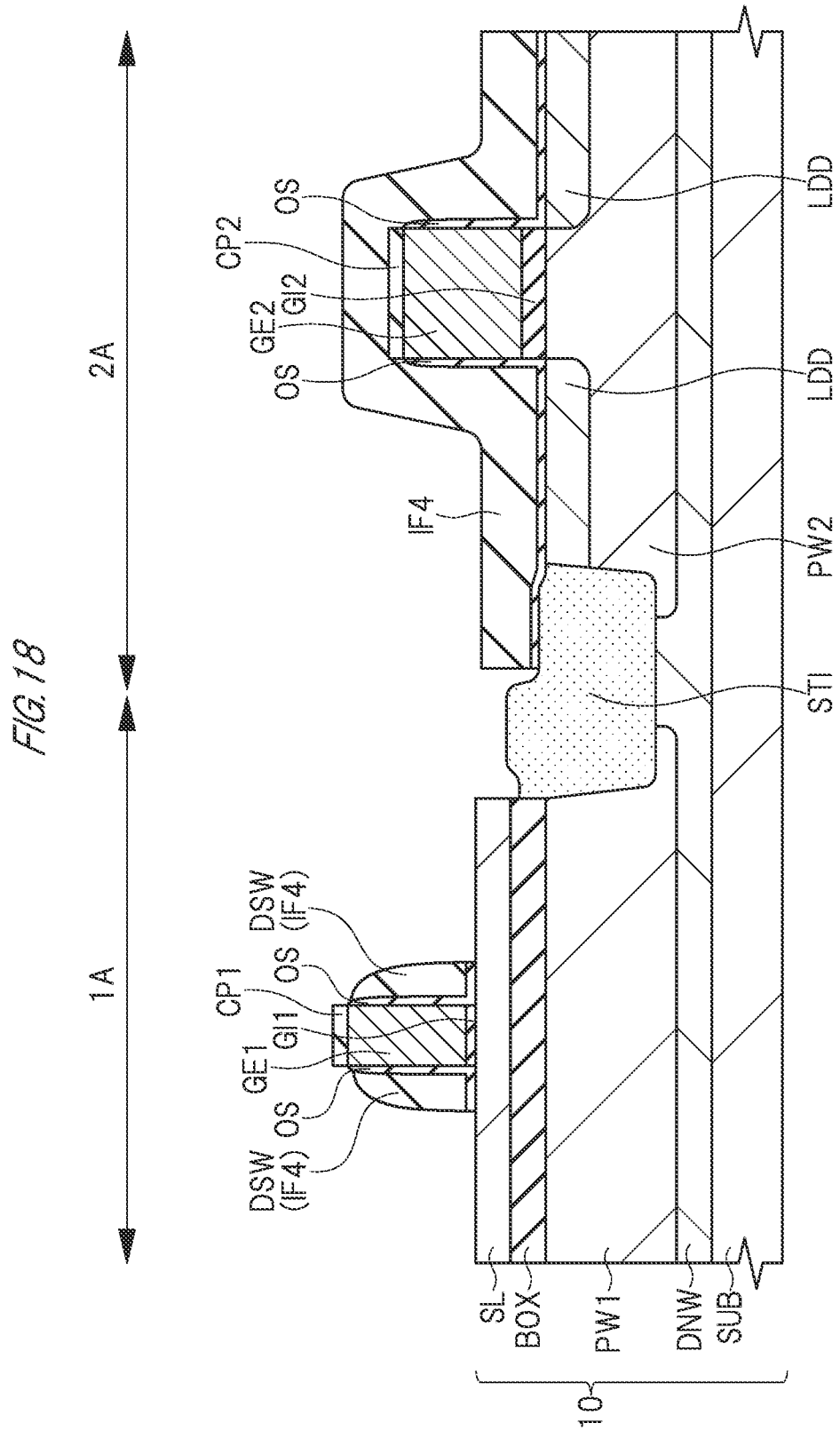
FIG. 18 is a sectional view showing a manufacturing process following that of FIG. 17.

Next, as shown in FIG. 18, a dummy sidewall spacer DSW is formed on the side surface of the gate electrode GE1 via an insulating film OS, an insulating film OS is formed on the side surface of the gate electrode GE2, and the gate electrode GE2 is covered with the insulating film IF4. First, in the region 1A and the region 2A, an insulating film OS made of, for example, a silicon oxide film is formed so as to cover the gate electrode GE1 and the gate electrode GE2 by, for example, a CVD method. Next, an n-type impurity region LDD is formed on the semiconductor substrate SUB in the region 2A by a photolithography method and an ion implantation method.

Next, in the region 1A and the region 2A, the insulating film IF4 made of, for example, a silicon nitride film is formed on the insulating film OS by, for example, the CVD method. Next, a resist pattern that covers the region 2A and opens the region 1A is formed. Next, by using the above resist pattern as a mask, an anisotropic etching process is performed to the insulating film IF4 in the region 1A. Consequently, the insulating film IF4 in the region 1A is processed, and the dummy sidewall spacer DSW is formed on the side surface of the gate electrode GE1 via the insulating film OS. Then, the above resist pattern is removed by an ashing treatment.

Figure 19:
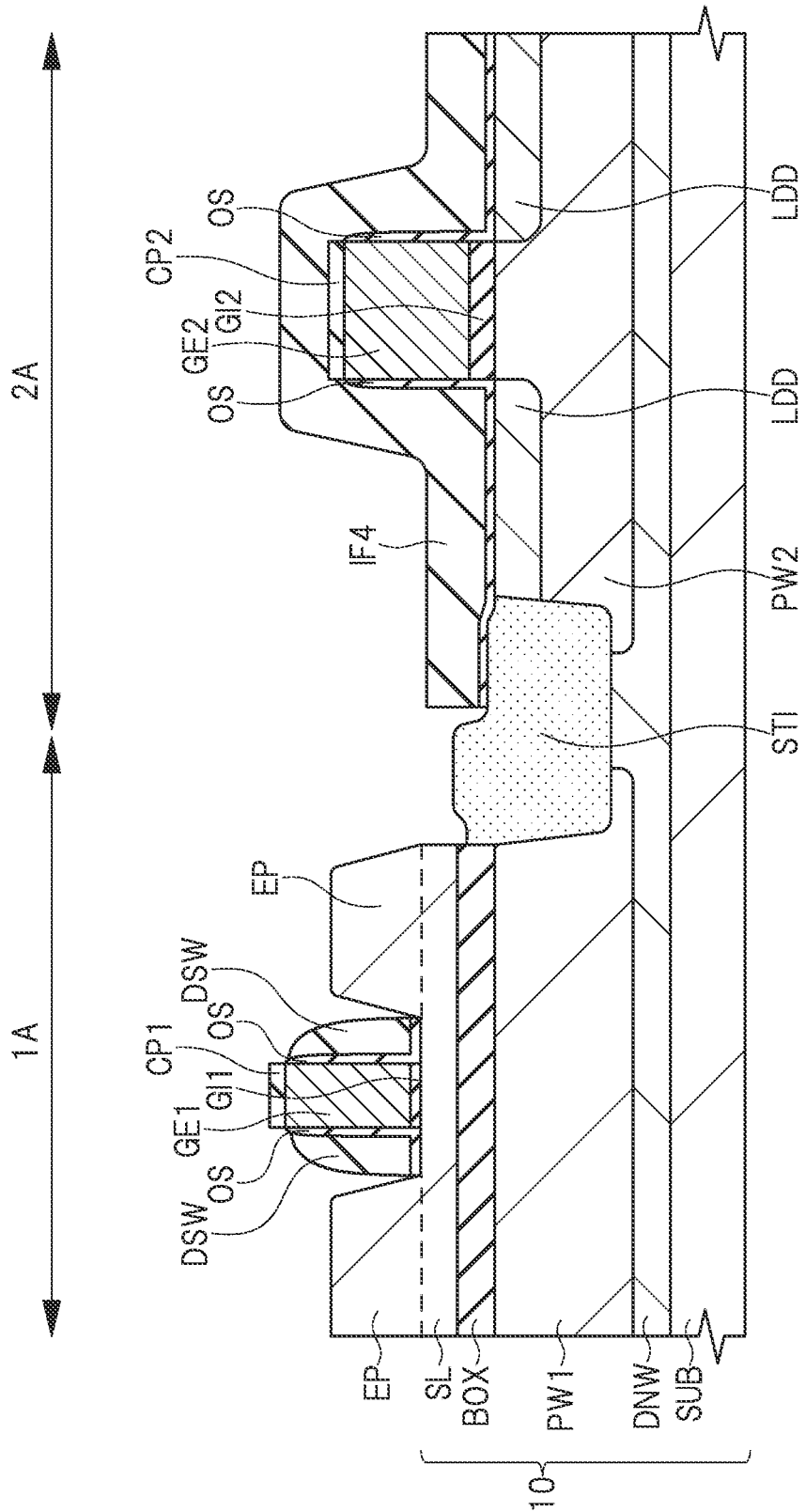
FIG. 19 is a sectional view showing a manufacturing process following that of FIG. 18.

Next, as shown in FIG. 19, an epitaxial layer EP made of, for example, monocrystalline silicon is formed on the semiconductor layer SL in the region 1A by an epitaxial growth method. At this time, since the gate electrode GE1 in the region 1A is covered with the cap film CP1, and the entire region 2A is covered with the insulating film IF4, so that the epitaxial layer EP is not formed at these locations. Then, a heat treatment is performed to the epitaxial layer EP in a hydrogen atmosphere. Incidentally, since the epitaxial layer EP is made of the same material as that of the semiconductor layer SL, both are integrated. However, in order to facilitate understanding of the invention, a boundary between the epitaxial layer EP and the semiconductor layer SL is shown by a broken line.

Figure 20:
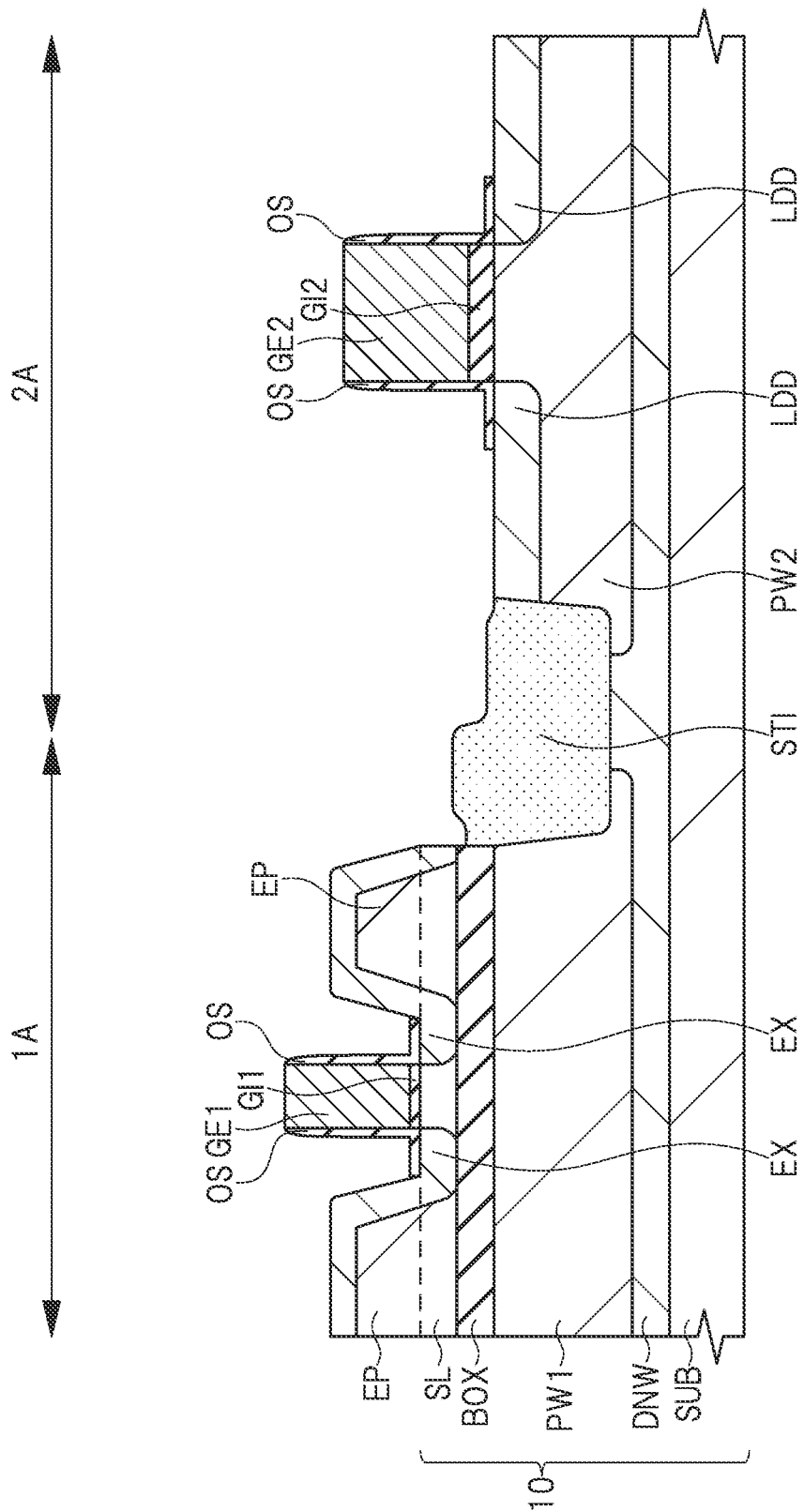
FIG. 20 is a sectional view showing a manufacturing process following that of FIG. 19.

Next, as shown in FIG. 20, the dummy sidewall spacer DSW, the insulating film IF4, and the cap films CP1, CP2 are removed. First, a resist pattern that covers the region 1A and opens the region 2A is formed. Next, by performing the anisotropic etching process using the above resist pattern as a mask, the insulating film IF4 in the region 2A is processed into a sidewall spacer shape. Next, the resist pattern is removed by an ashing treatment. Next, the dummy sidewall spacer DSW, the insulating film IF4, and the cap films CP1, CP2 are removed by wet etching process.

Next, by using a photolithography method and an ion implantation method, an n-type extension region EX is selectively formed in the semiconductor layer SL and the epitaxial layer EP on both sides of the gate electrode GE1 in the region 1A.

Figure 21:
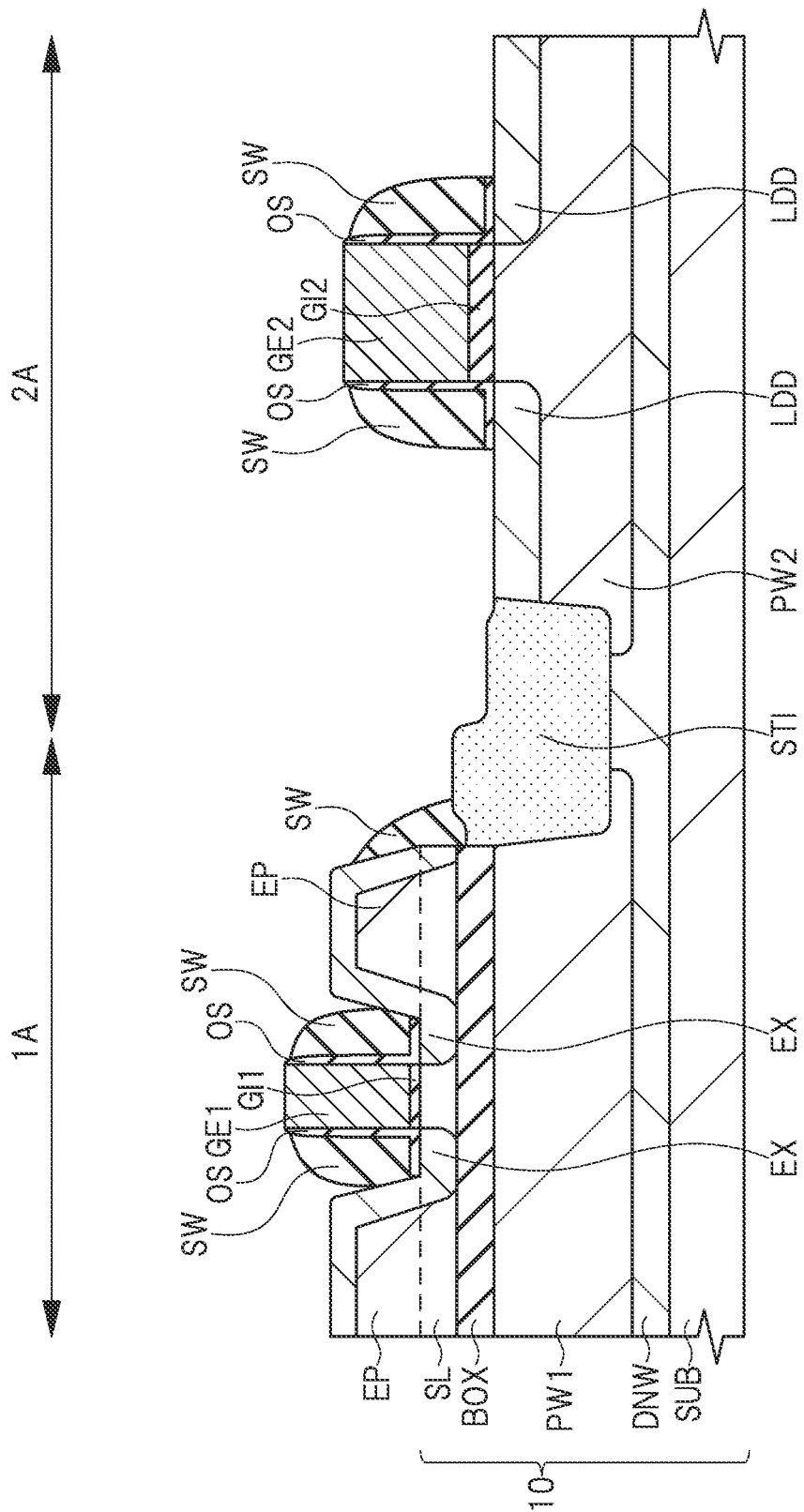
FIG. 21 is a sectional view 10 a manufacturing process following that of FIG. 20.

Next, for example, a silicon nitride film is formed so as to cover the region 1A and the region 2A by, for example, a CVD method. Then, by performing the anisotropic etching process to the silicon nitride film, as shown in FIG. 21, the sidewall spacer SW is formed on each side surface of the gate electrode GE1 and the gate electrode GE2 via the insulating film OS. Further, the sidewall spacer SW is also formed on the element isolation portion STI, and a part of a side surface of the epitaxial layer EP is covered with the sidewall spacer SW.

After the step of FIG. 21, the semiconductor device shown in FIG. 1 is manufactured through the following steps. First, by using a photolithography method and an ion implantation method, an n-type diffusion region ND1 is formed in the epitaxial layer EP and the semiconductor layer SL in the region 1A, and an n-type diffusion region ND2 is formed in the semiconductor substrate SUB in the region 2A. Next, by a salicide technique, a silicide layer SI is formed on each upper surface of the diffusion region ND1, the diffusion region ND2, the gate electrode GE1, and the gate electrode GE2. Thus, the MISFET 1Q is formed in the region 1A, and the MISFET 2Q is formed in the region 2A.

Although the present invention has been specifically described above based on the above-described embodiment, the present invention is not limited to the above-mentioned embodiment and can be variously modified without departing from the gist thereof.

What is claimed is:

1. A method of manufacturing a semiconductor device having a first region in which a first MISFET is to be formed and a second region in which a second MISFET is to be formed, comprising:

(a) preparing an SOI substrate having a semiconductor substrate, an insulating layer formed on the semiconductor substrate, and a semiconductor layer formed on the insulating layer;

(b) after the step (a), in each of the first region and the second region, forming a first insulting film on the semiconductor layer, the first insulating film being made of a material different from a material of the insulating layer;

(c) after the (b), in each of the first region and the second region, forming a mask pattern by pattering the first insulating film;

(d) after the (c), in each of the first region and the second region, forming a plurality of trenches each reaching an inside of the semiconductor substrate by performing an etching process with the mask pattern as a mask, and exposing each of a side surface of the semiconductor layer, a side surface of insulating layer and a side surface of the semiconductor substrate in an inside of each of the plurality of trenches;

(e) after the (d), in each of the first region and the second region, retreating the side surface of the insulating layer from the side surface of the semiconductor layer and the side surface of the semiconductor substrate by cleaning the inside of each of the plurality of trenches;

(f) after the (e), in each of the first region and the second region, embedding an organic film into the inside of each of the plurality of trenches;

(g) after the (f), covering the side surface of the insulating layer in the first region with the organic film and also exposing the side surface of the semiconductor layer in the first region from the organic film by performing an anisotropic etching process to the organic film in the first region;

(h) after the (g), in each of the first region and the second region, approaching each of the side surface of the semiconductor layer in the first region and the side surface of the semiconductor substrate in the first region to the side surface of the insulating layer in the first region by performing an anisotropic etching process, the isotropic etching process having a condition in which the organic film, the semiconductor layer and the semiconductor substrate are more easily etched than the insulating layer;

(i) after the (h), in each of the first region and the second region, removing the organic film;

(j) after the (i), in each of the first region and the second region, performing an oxidation treatment to each of the side surface of the semiconductor layer and the side surface of the semiconductor substrate; and (k) after the (j), in each of the first region and the second region, embedding a second insulating film into the inside of each of the plurality of trenches.

2. The method of manufacturing a semiconductor device according to claim 1, wherein a part of the side surface of the semiconductor substrate in the first region is also exposed from the organic film in the (g).

3. The method of manufacturing a semiconductor device according to claim 1, wherein the side surface of the semiconductor layer in the second region, the side surface of the insulating layer in the second region, and the side surface of the semiconductor substrate in the second region are covered with the organic film in the second region during the isotropic etching process in the (h).

4. The method of manufacturing a semiconductor device according to claim 3, wherein the (j) is performed in a state where a part of an upper surface of the semiconductor substrate in the second region is exposed from the insulating layer in the second region.

5. The method of manufacturing a semiconductor device according to claim 1, further comprising:
   (l) between the (j) and the (k), in each of the first region and the second region, approaching a side surface of the mask pattern to the side surface of the insulating layer by performing an isotropic etching process to the mask patter.

6. The method of manufacturing a semiconductor device according to claim 5,
   wherein the (k) includes:
   (k1) in each of the first region and the second region, forming the second insulating film on the mask pattern by a CVD method so as to embed the inside of each of the plurality of trenches; and
   (k2) after the (k1), removing the second insulating film formed on the mask pattern by a CMP method.

7. The method of manufacturing a semiconductor device according to claim 1, further comprising:
   (m) after the (k), exposing the semiconductor substrate in the second region by removing each of the semiconductor layer in the second region and the insulating layer in the second region;
   (n) after the (m), forming a second gate insulating film of the second MISFET on the semiconductor substrate in the second region; and
   (o) after the (n), forming a first gate insulating film of the first MISFET on the semiconductor layer in the first region, the first gate insulating film having a thickness thinner than a thickness of the second gate insulating film; and
   (p) after the (n) and the (o), forming a first gate electrode of the first MISFET on the first gate insulating film, and forming a second gate electrode of the second MISFET on the second gate insulating film.

8. The method of manufacturing a semiconductor device according to claim 1,
   wherein the semiconductor layer and the second substrate are made of silicon,
   wherein the insulating layer is made of silicon oxide, and
   wherein the first insulating film is made of a silicon nitride.

* * * * *